(12) United States Patent
Inaba

(10) Patent No.: US 10,446,204 B2
(45) Date of Patent: Oct. 15, 2019

(54) SEMICONDUCTOR MEMORY DEVICE

(71) Applicant: TOSHIBA MEMORY CORPORATION, Minato-ku, Tokyo (JP)

(72) Inventor: Tsuneo Inaba, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 129 days.

(21) Appl. No.: 15/702,298

(22) Filed: Sep. 12, 2017

(65) Prior Publication Data
US 2018/0277182 A1 Sep. 27, 2018

(30) Foreign Application Priority Data

Mar. 22, 2017 (JP) .................................. 2017-056342

(51) Int. Cl.
| | | |
|---|---|---|
| *G11C 11/15* | (2006.01) | |
| *G11C 11/16* | (2006.01) | |
| *G11C 8/08* | (2006.01) | |
| *G11C 13/00* | (2006.01) | |
| *G11C 7/18* | (2006.01) | |
| *G11C 8/14* | (2006.01) | |

(52) U.S. Cl.
CPC ................ *G11C 11/15* (2013.01); *G11C 8/08* (2013.01); *G11C 11/1653* (2013.01); *G11C 11/1655* (2013.01); *G11C 11/1657* (2013.01); *G11C 11/1673* (2013.01); *G11C 11/1693* (2013.01); *G11C 13/004* (2013.01); *G11C 7/18* (2013.01); *G11C 8/14* (2013.01); *G11C 2013/0054* (2013.01); *G11C 2207/002* (2013.01)

(58) Field of Classification Search
CPC ...................................................... G11C 11/15
See application file for complete search history.

(56) References Cited

U.S. PATENT DOCUMENTS

| | | | |
|---|---|---|---|
| 7,652,929 B2 | 1/2010 | Li | |
| 8,199,603 B2 | 6/2012 | Chung et al. | |
| 8,842,489 B2 | 9/2014 | Yu et al. | |
| 2007/0091665 A1* | 4/2007 | Oh | G11C 11/5678 365/148 |
| 2009/0003048 A1* | 1/2009 | Ro | G11C 13/00 365/163 |
| 2009/0237988 A1 | 9/2009 | Kurose et al. | |
| 2012/0300532 A1 | 11/2012 | Yamazaki et al. | |
| 2016/0379699 A1* | 12/2016 | Takahashi | G11C 11/1673 365/158 |
| 2018/0158523 A1* | 6/2018 | Rho | G11C 11/1673 |

FOREIGN PATENT DOCUMENTS

| | | |
|---|---|---|
| JP | 2003109374 A | 4/2003 |
| JP | 2009230798 A | 10/2009 |
| JP | 2012243372 A | 12/2012 |

* cited by examiner

*Primary Examiner* — Tri M Hoang
(74) *Attorney, Agent, or Firm* — Holtz, Holtz & Volek PC

(57) ABSTRACT

According to one embodiment, a semiconductor memory device includes a first memory cell including a first resistance change memory element and a first transistor, a first word line electrically coupled to a control terminal of the first transistor, and a first circuit configured to, in a reading, apply a first voltage to the first word line during a first period and apply a second voltage higher than the first voltage to the first word line during a second period after the first period.

15 Claims, 18 Drawing Sheets

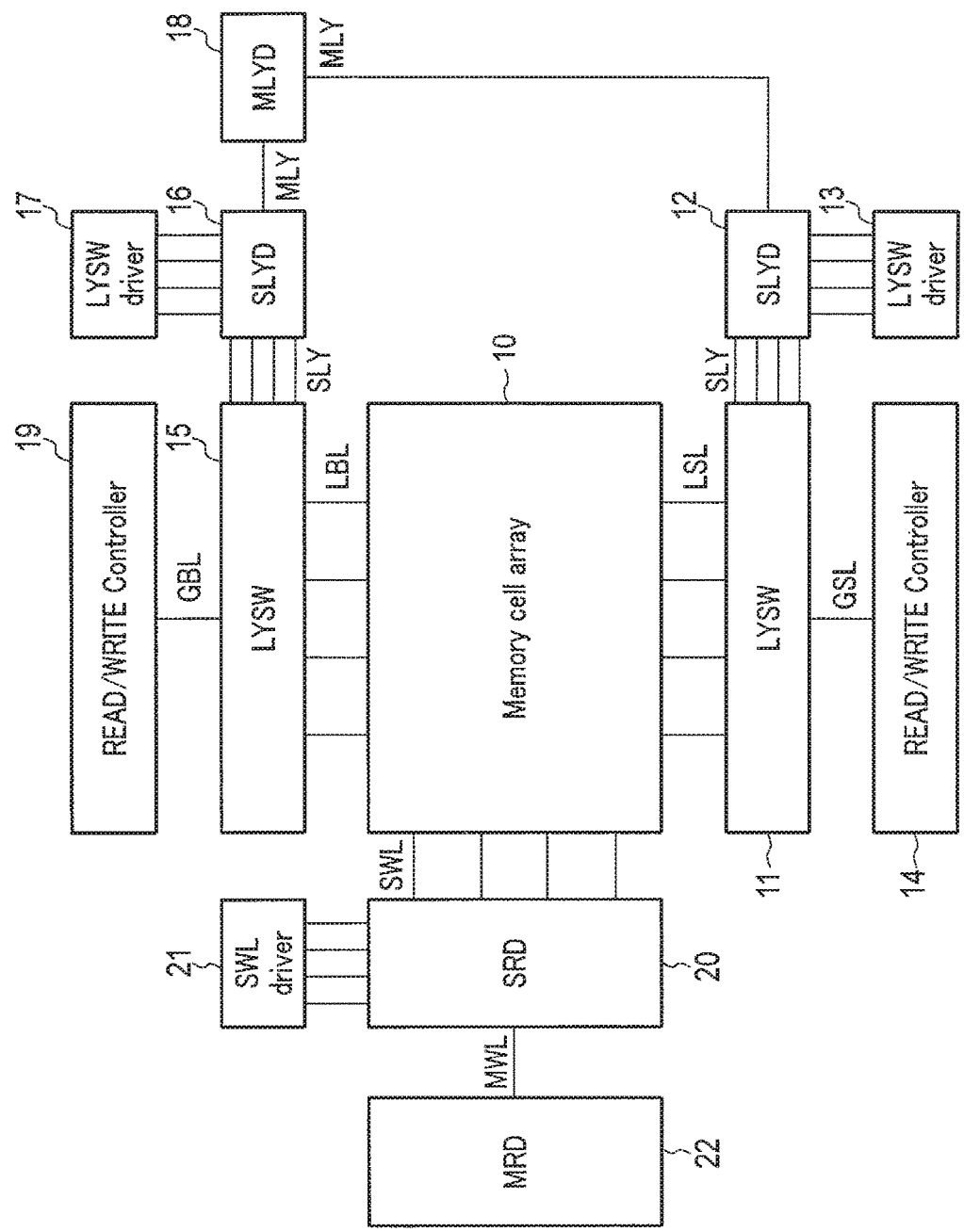
F I G. 1

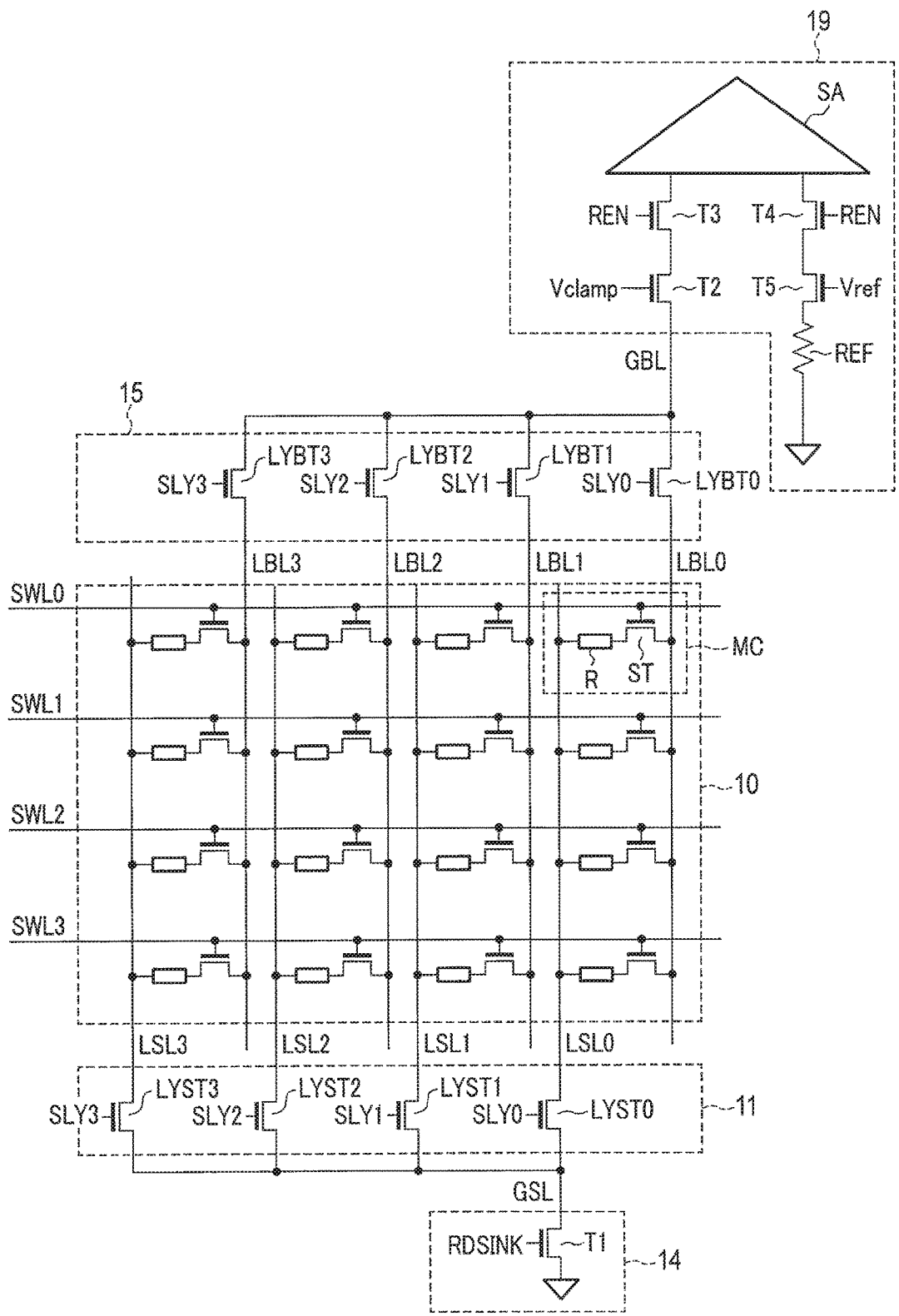
F I G. 2

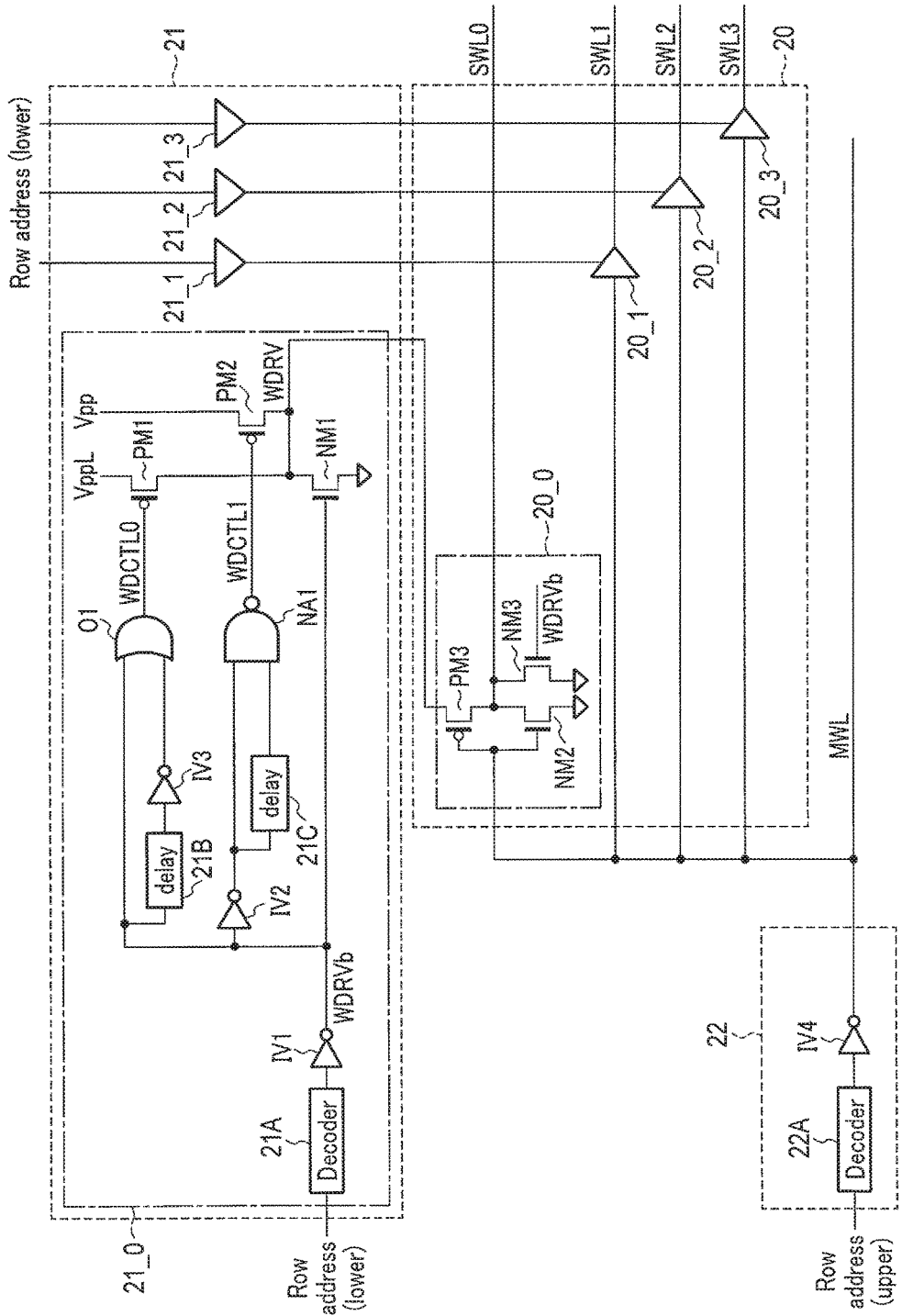
F I G. 5

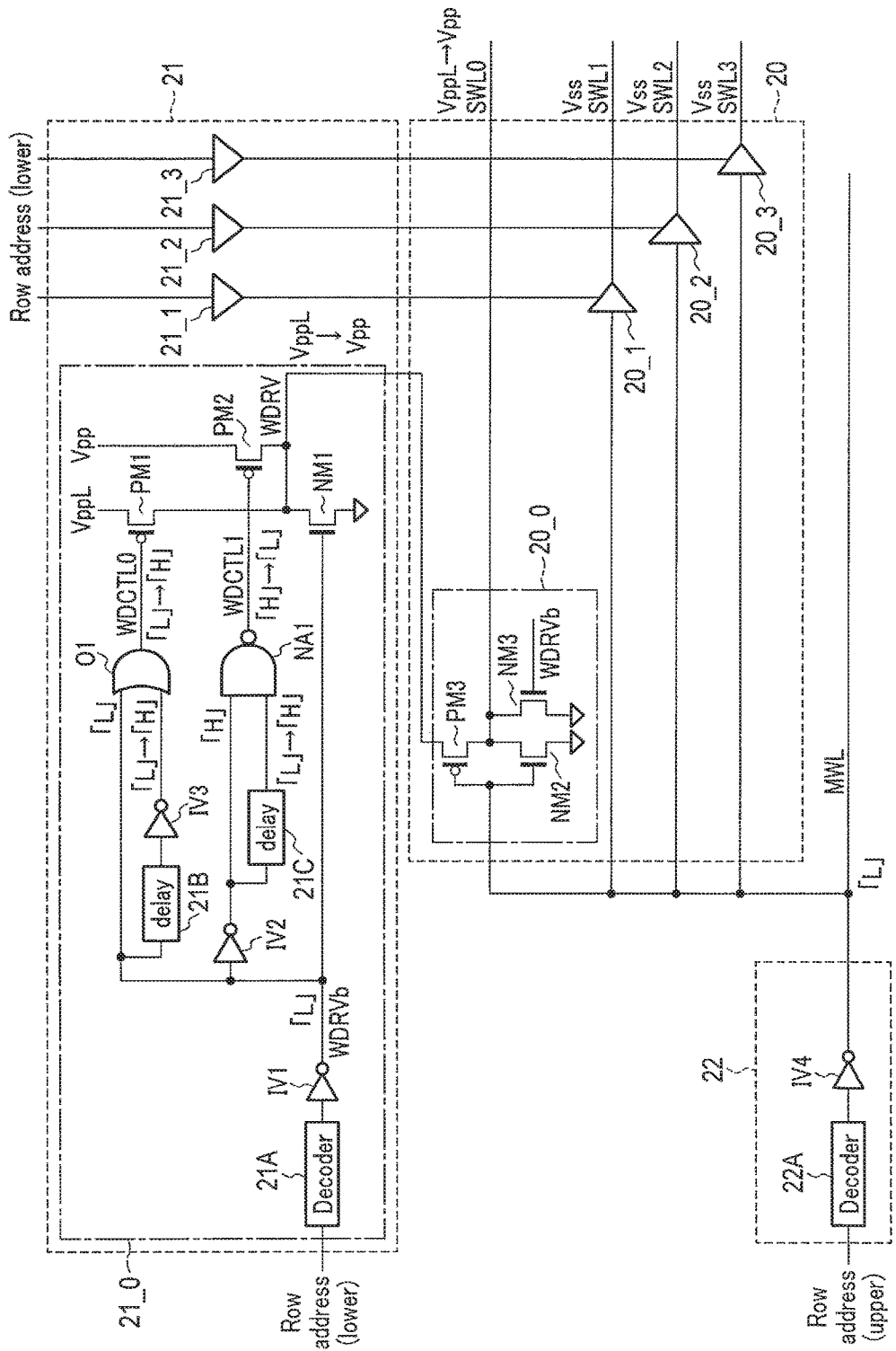
F I G. 9

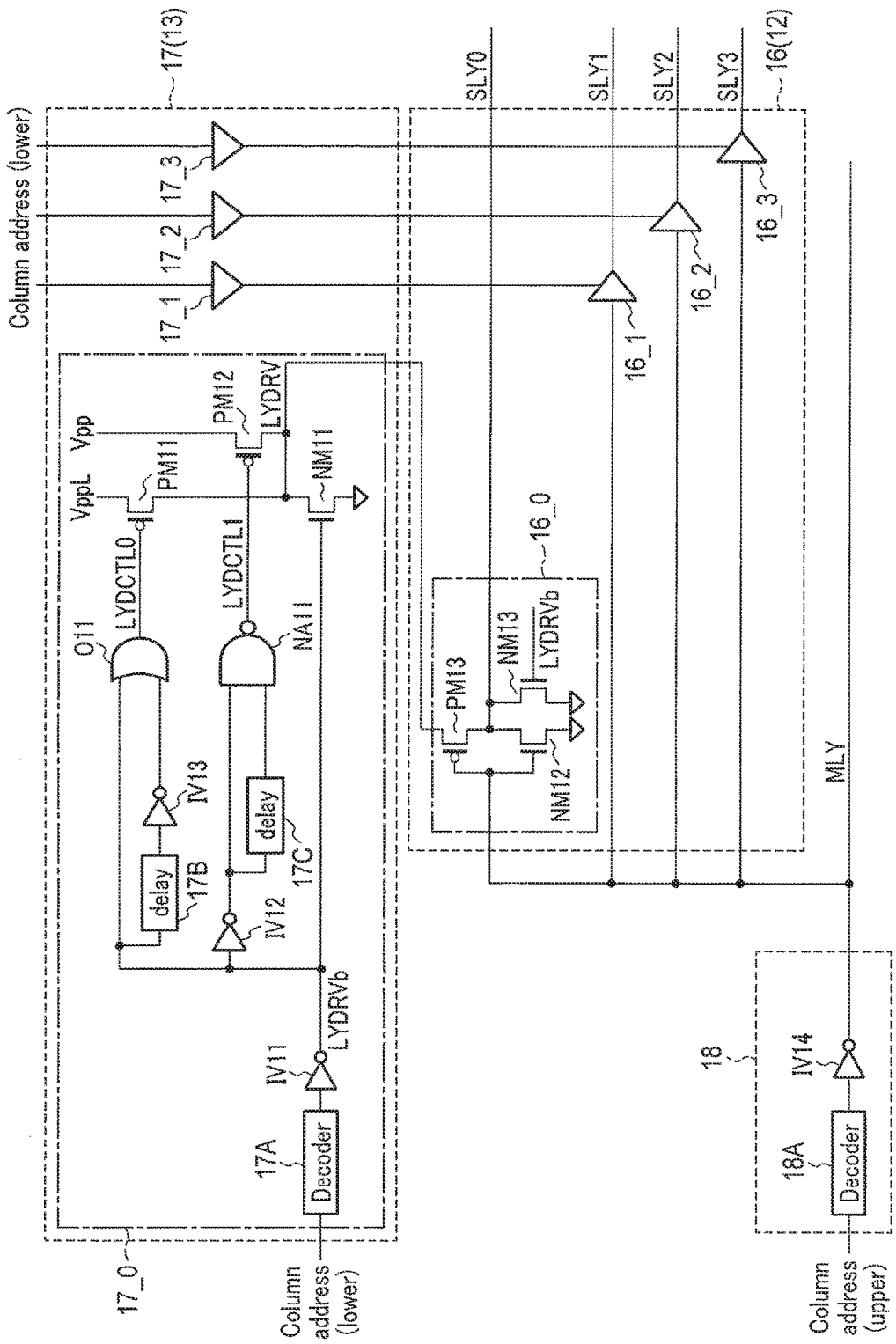
F I G. 11

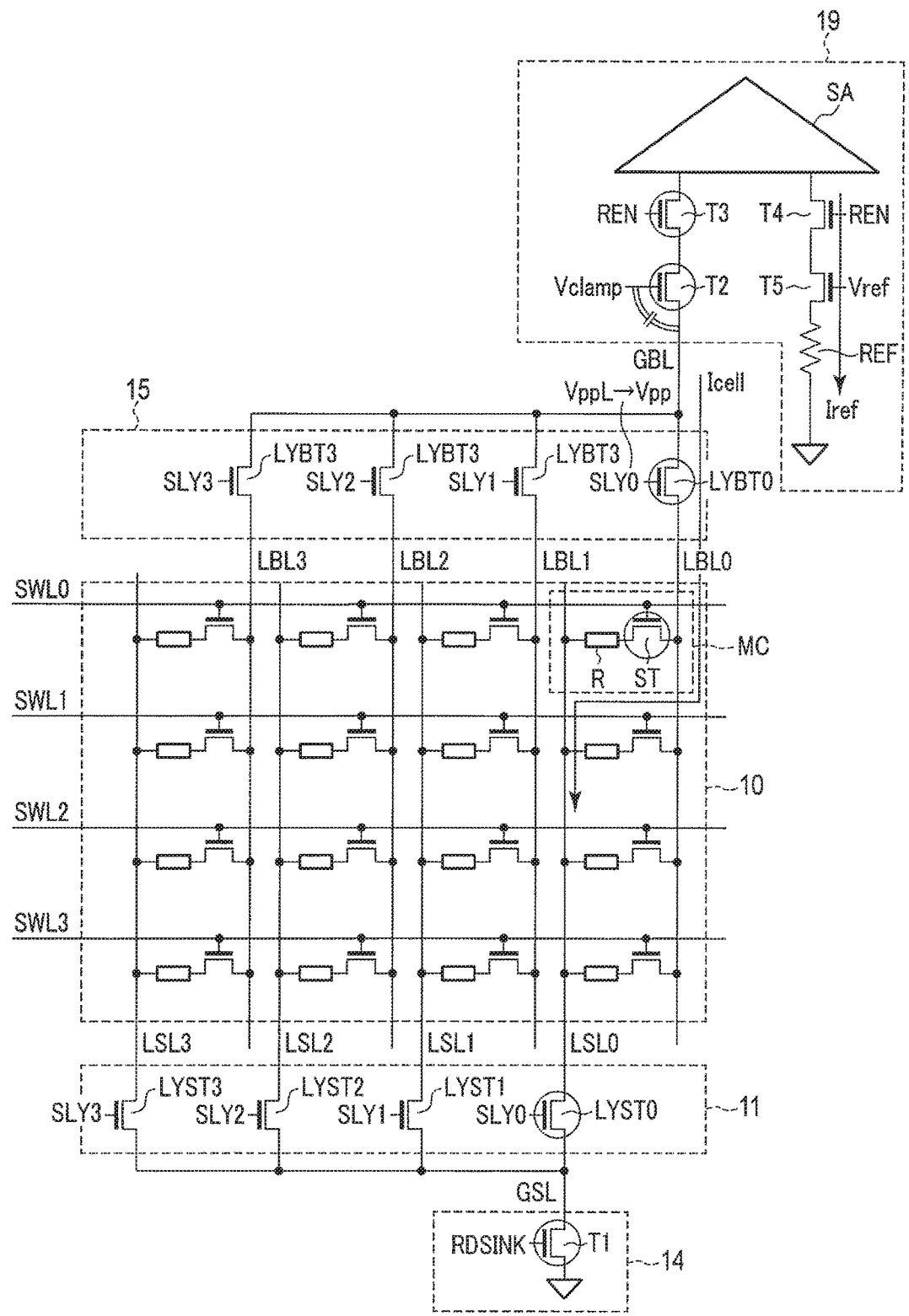
F I G. 13

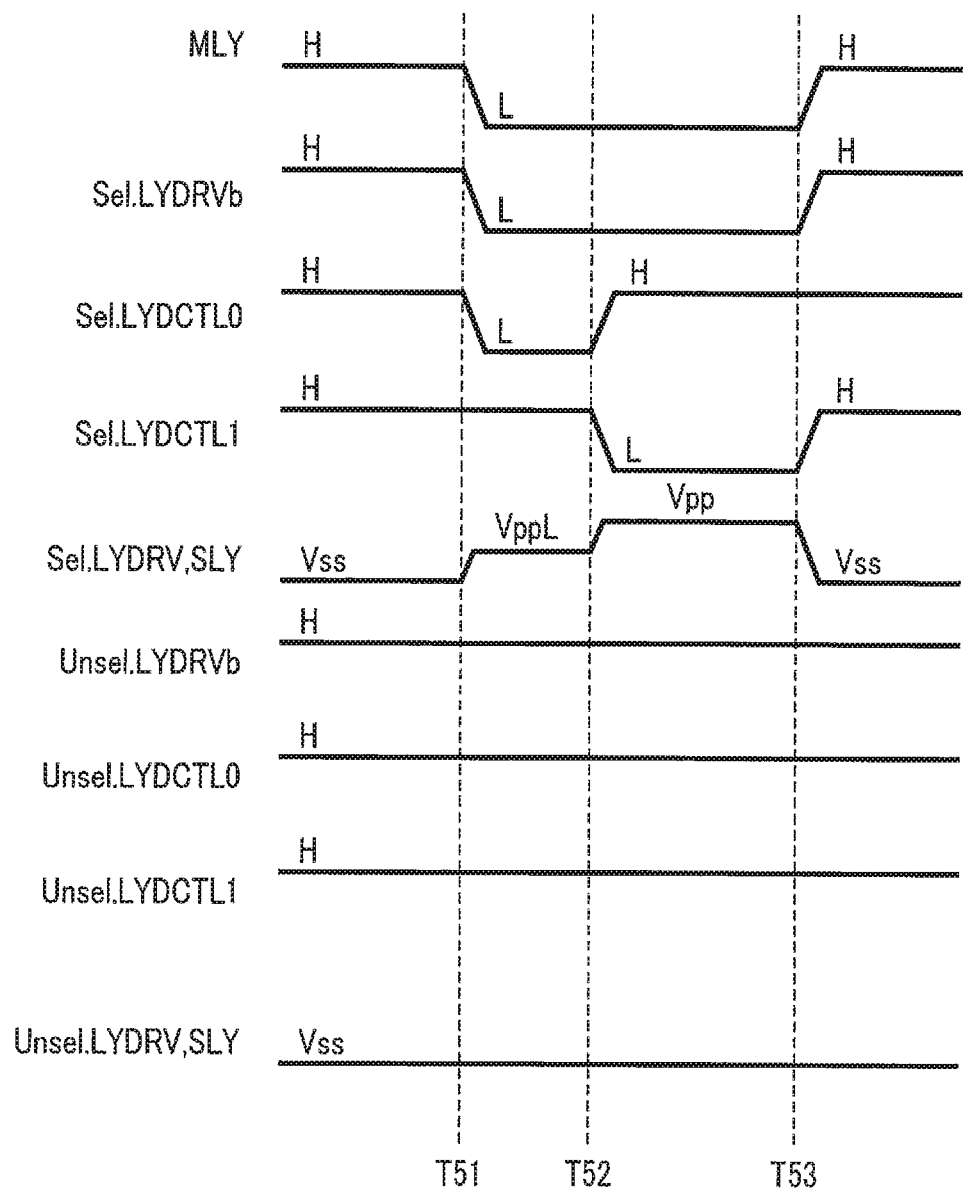
F I G. 14

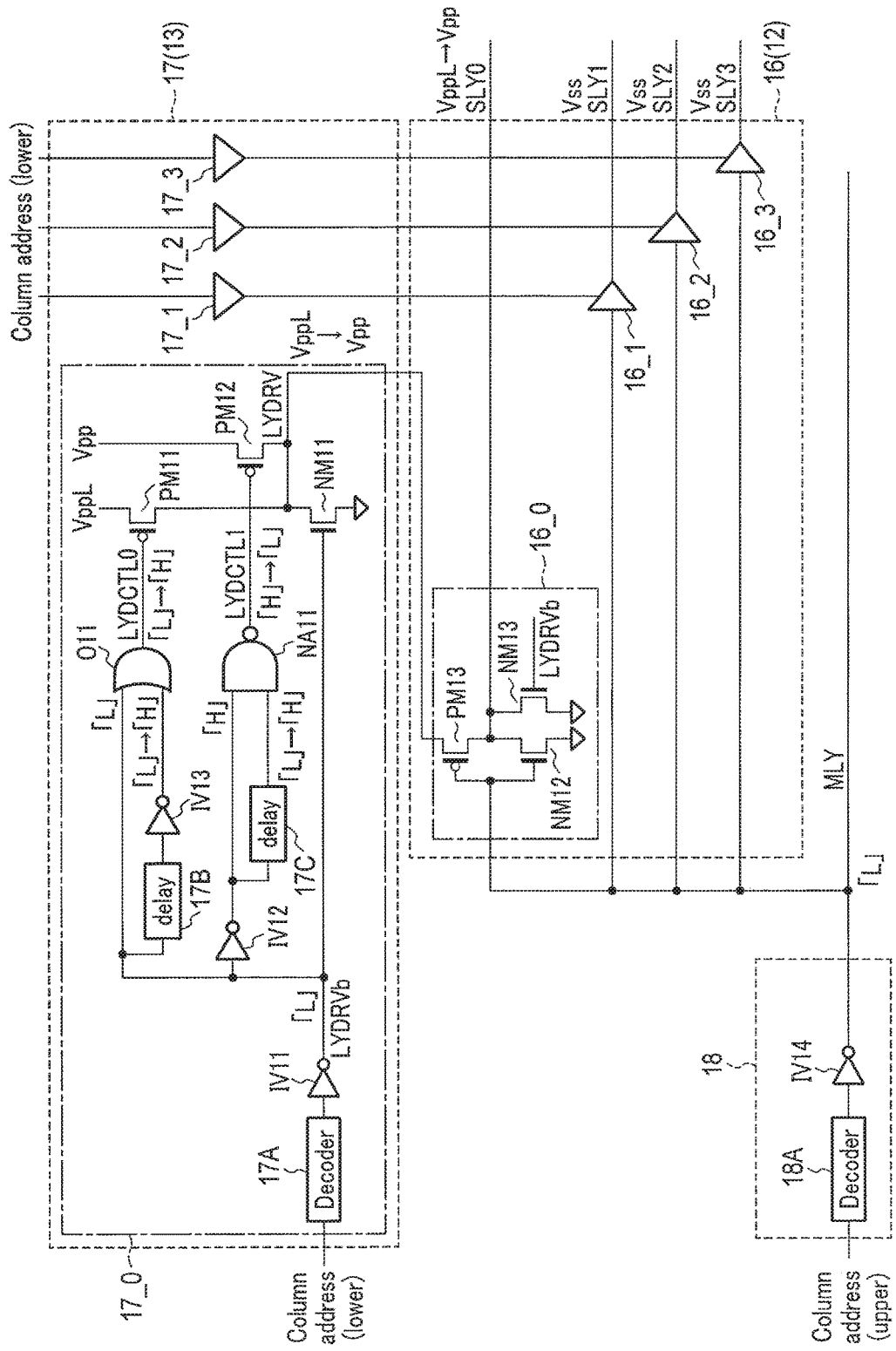
F I G. 15

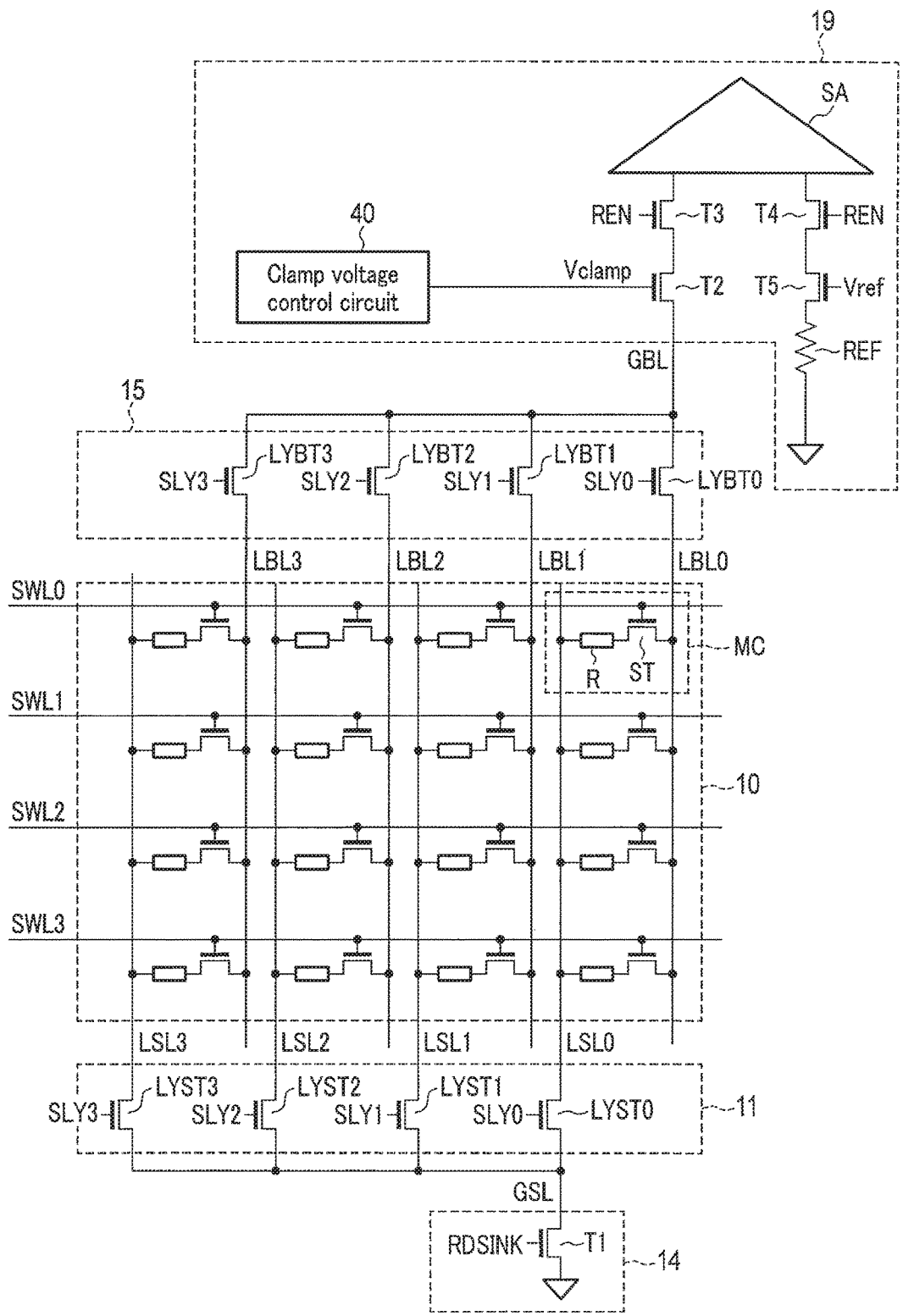
F I G. 16

SEMICONDUCTOR MEMORY DEVICE

CROSS-REFERENCE TO RELATED APPLICATIONS

This application is based upon and claims the benefit of priority from the prior Japanese Patent Application No. 2017-056342, filed Mar. 22, 2017, the entire contents of which are incorporated herein by reference.

FIELD

Embodiments described herein relate generally to a semiconductor memory device.

BACKGROUND

A magnetic random access memory (MRAN) is a memory device which uses, as a memory cell for storing information, a memory element having the magnetoresistamce effect. The MRAM is attracting attention as a next-generation memory device characterized by a high-speed operation, large capacity, and nonvolatility.

BRIEF DESCRIPTION OF THE DRAWINGS

FIG. 1 is a block diagram showing a semiconductor memory device according to the first embodiment;

FIG. 2 is a circuit diagram showing a memory cell array, local column switches, and read/write controllers in the semiconductor memory device according to the first embodiment;

FIG. 5 is a circuit diagram showing the sub row decoder, the sub word line driver, and the main row decoder in the semiconductor memory device according to the first embodiment;

FIG. 9 is a circuit diagram showing the sub row decoder, the sub word line driver, and the main row decoder in a reading in the semiconductor memory device according to the first embodiment;

FIG. 11 is a circuit diagram showing a sub local column decoder, a local column switch driver, and a main local column decoder in a semiconductor memory device according to the second embodiment;

FIG. 13 is a circuit diagram showing the memory cell array and read/write controller in a reading in the semiconductor memory device according to the second embodiment;

FIG. 14 is a timing chart showing various voltages of the sub local column decoder, local column switch driver, and main local column decoder in a reading in semiconductor memory device according to the second embodiment;

FIG. 15 is a circuit diagram showing the sub local column decoder, local column switch driver, and main local column decoder in a reading in semiconductor memory device according to the second embodiment;

FIG. 16 is a circuit diagram showing a memory cell array, local column switches, and read/write controllers in a semiconductor memory device according to the third embodiment;

DETAILED DESCRIPTION

Figure 3A:
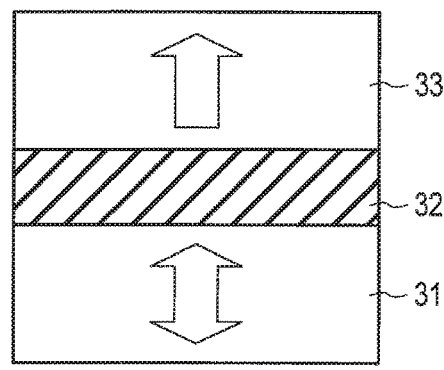
FIG. 3A is a sectional view showing a variable resistance element in the semiconductor memory device according to the first embodiment.

In general, according to one embodiment, a semiconductor memory device includes a first memory cell including a first resistance change memory element and a first transistor, a first word line electrically coupled to a control terminal of the first transistor, and a first circuit configured to, in a reading, apply a first voltage to the first word line during a first period and apply a second voltage higher than the first voltage to the first word line during a second period after the first period.

Embodiments will be described below with reference to the accompanying drawings. The same reference numerals denote the same parts in the drawings.

<First Embodiment>

A semiconductor memory device according to the first embodiment will be described below with reference to FIGS, 1, 2, 3A, 3B, 3C, 4, 5, 6, 7, 8, 9, and 10. Although an MRAM which stores data using a magnetoresistance effect element (Magnetic Tunnel Junction (MTJ) element) as a resistance change memory element will be exemplified below, the present invention is not limited to this. This embodiment is applicable to any memory which converts the resistance difference of a resistance change memory element into a current difference or voltage difference and senses it.

Note that in the following description, a term "couple" includes not only direct coupling but also coupling via an arbitrary element, unless otherwise specified. The first terminal of a transistor indicates one of a source and drain, and the second terminal of the transistor indicates the other one. The control terminal of the transistor indicates a gate.

[Arranagement Example of First Embodiment]

FIG. 1 is a block diagram showing the semiconductor memory device (MRAM) according to the first embodiment.

As shown in FIG. 1, the semiconductor memory device includes a memory cell array 10, local column switches (LYSWs) 11 and 15, sub local column decoders (SLYDs) 12 and 16, local column switch drivers 13 and 17, a main local column decoder (MLYD) 18, read/write controllers 14 and 19, a sub row decoder (SRD) 20, a sub word line driver 21, and a main row decoder (MRD) 22.

The memory cell array 10 includes a plurality of MATs. Each MAT includes a plurality of banks. Each bank includes a plurality of memory cells MC for storing data. The respective memory cells MC are provided at the intersecting positions between sub word lines SWL and local bit lines LBL and local source lines LSL. Therefore, the plurality of memory cells MC are arranged in a matrix.

The main local column decoder 18 decodes a main column address (upper column address), and selects and activates a main local column control line MLY.

The local column switch driver 13 decodes a sub column address (lower column address), and generates a voltage to be supplied to a sub local column control line SLY on the source line side.

In accordance with decoding by the main local column decoder 18 and the local column switch driver 13, the sub local column decoder 12 supplies (applies) the voltage to the selected sub local column control line SLY on the source line side. That is, the sub local column decoder 12, the local column switch driver 13, and the main local column decoder 18 control ON/OFF of the local column switch 11.

The local column switch 11 selectively couples the local source line LSL to a global source line GSL in accordance with the voltage supplied from the sub local column decoder 12.

The local column switch driver 17 decodes the sub column address (lower column address), and generates a voltage to be supplied to a sub local column control line SLY on the bit line side.

In accordance with decoding by the main local column decoder 18 and the local column switch driver 17, the sub local column decoder 16 supplies (applies) the voltage to the selected sub local column control line SLY on the bit line side. That is, the sub local column decoder 16, the local column switch driver 17, and the main local column decoder 18 control ON/OFF of the local column switch 15.

The local column switch 15 selectively couples the local bit line LBL to the global bit line GBL in accordance with the voltage supplied from the sub local column decoder 16.

Note that the sub local column decoders 12 and 16 and the local column switch drivers 13 and 17 may be shared by the local column switches (LYSWs) 11 and 15. In this case, the corresponding sub local column control lines SLY on the source line side and on the bit line side are selected at the same time.

The read/write controller 14 includes a sink and write driver, and is electrically coupled to the global source line GSL. The sink is, for example, a ground voltage. In a reading, a read current flows into the sink. In a writing, the write driver applies a write voltage to the global source line GSL. This causes a write current to flow out from the write driver or a write current to flow into the write driver.

The read/write controller 19 includes a sense amplifier SA and a write driver, etc., and is electrically coupled to a global bit line GBL. In a reading, the sense amplifier SA reads data from the memory cell MC by detecting a read current or read voltage. In a writing, the write driver applies a write voltage to the global bit line GBL. This causes a write current to flow out from the write driver or a write current to flow into the write driver.

The main row decoder 22 decodes a main row address (upper row address), and selects and activates a main word line MWL.

The sub word line driver 21 decodes a sub row address (lower row address), and generates a voltage to be supplied to the sub word line SWL.

In accordance with decoding by the main row decoder 22 and the sub word line driver 21, the sub row decoder 20 supplies the voltage to the selected sub word line SWL.

FIG. 2 is a circuit diagram showing the memory cell array 10, the local column switches 11 and 15, and the read/write controllers 14 and 19 in the semiconductor memory device according to the first embodiment.

As shown in FIG. 2, the memory cell array 10 is provided with the local bit lines LBL (LBL0 to LBL3), the local source lines LSL (LSL0 to LSL3), and the sub word lines SWL (SWL0 to SWL3). The local bit lines LBL and the local source lines LSL extend in the first direction. The local bit lines LBL and the local source lines LSL are alternately arranged in the second direction intersecting the first direction. The sub word lines SWL extend in the second direction. The memory cell array 10 includes the plurality of memory cells MC. The respective memory cells MC are provided at the intersecting positions between the sub word lines SWL and the local bit lines LBL and local source lines LSL. Therefore, the plurality of memory cells MC are arranged in a matrix in the first and second directions.

Note that the number of local bit lines LBL, that of local source lines LSL, and that of sub word lines SWL are merely examples, and are not particularly limited.

Each memory cell MC includes, for example, a resistance change memory element R and a selection transistor ST. One end of the resistance change memory element R is electrically coupled to the corresponding local source line LSL and the other end of the resistance change memory element R is electrically coupled to the first terminal of the selection transistor ST. The second terminal of the selection transistor ST is electrically coupled to the corresponding local bit line LBL, and the control terminal of the selection transistor ST is electrically coupled to the corresponding sub word line SWL.

The resistance change memory element R is an element having a resistance value which changes by applying a current (or voltage). The resistance change memory element R includes, for example, an MTJ element, a phase change element, and a ferroelectric element. The memory cell MC is selected when the selection transistor ST is turned on by the sub word line SWL. Note that a case in which the MRAM, that is, the resistance change memory element R is an MTJ element will be explained.

FIG. 3A is a sectional view showing the resistance change memory element R in the semiconductor memory device according to the first embodiment. FIG. 3A mainly shows a memory layer 31, a tunnel barrier layer 32, and a reference layer 33 as the resistance change memory element R.

As shown in FIG. 3A, the resistance change memory element R includes a stack formed by the memory layer 31 as a ferromagnetic layer, the reference layer 33 as a ferromagnetic layer, and the tunnel barrier layer 32 as a nonmagnetic layer formed between them.

The memory layer 31 is a ferromagnetic layer in which the magnetization direction is variable, and has perpendicular magnetic anisotropy which is perpendicular to or almost perpendicular to the film surfaces (upper surface/lower surface). The expression "the magnetization direction is variable" indicates that the magnetization direction changes with respect to a predetermined write current. In addition, the expression "almost perpendicular" means that the direction of residual magnetization falls within the range of 45°<θ≤90° with respect to the film surfaces. The memory layer 31 is made of, for example, cobalt iron boron (CoFeB) or iron boride (FeB).

The tunnel barrier layer 32 is formed on the memory layer 31. The tunnel barrier layer 32 is a nonmagnetic layer, and is made of, for example, MgO.

The reference layer 33 is formed on the tunnel barrier layer 32. The reference layer 33 is a ferromagnetic layer in which the magnetization direction is invariable, and has perpendicular magnetic anisotropy which is perpendicular to or almost perpendicular to the film surfaces. The expression "the magnetization direction is invariable" indicates that the magnetization direction is invariable with respect to the predetermined write current. That is, the reference layer 33 has a switching energy barrier larger than that of the memory layer 31 in the magnetization direction. The reference layer 33 is made of, for example, cobalt platinum (CoPt), cobalt nickel (CoNi), or cobalt palladium (CoPd).

FIG. 38 is a sectional view for explaining write of the resistance change memory element R in the semiconductor memory device according to the first embodiment and showing the resistance change memory element in a parallel state (P state). FIG. 3C is a sectional view for explaining write of the resistance change memory element R in the semiconductor memory device according to the first embodiment and showing the resistance change memory element in an anti-parallel state (AP state).

The resistance change memory element R is, for example, a spin transfer resistance change memory element. Therefore, when writing data in the resistance change memory element R or reading data from the resistance change memory element R, currents are bidirectionally supplied to the resistance change memory element R in a direction perpendicular to the film surfaces.

More specifically, data is written in the resistance change memory element R as follows.

Figure 3B:
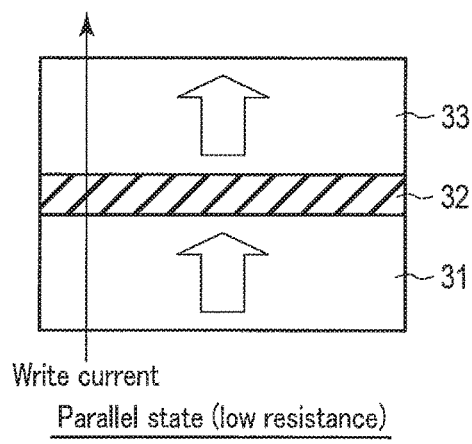
FIG. 3B is a sectional view for explaining write of the variable resistance element in the semiconductor memory device according to the first embodiment and showing the variable resistance element in a parallel state (P state)
Figure 3C:
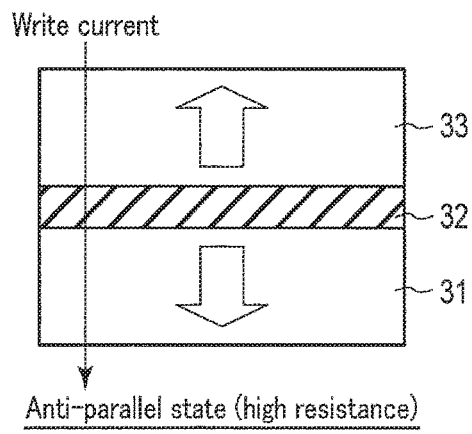
FIG. 3C is a sectional view for explaining write of the variable resistance element in the semiconductor memory device according to the first embodiment and showing the variable resistance element in an anti-parallel state (AP state)

As shown in FIG. 3B, when a current flows from the memory layer 31 to the reference layer 33, that is, when electrons moving from the reference layer 33 to the memory layer 31 are supplied, electrons spin-polarized in the same direction as the magnetization direction in the reference layer 33 are injected into the memory layer 31. In this case, the magnetization direction in the memory layer 31 is matched with that in the reference layer 33. Consequently, the magnetization directions in the reference layer 33 and memory layer 31 are parallel. In this parallel state, the resistance value of the resistance change memory element R becomes smallest. This state is defined as, for example, "0" data.

On the other hand, as shown in FIG. 3C, when a current flows from the reference layer 33 to the memory layer 31, that is, when electrons moving from the memory layer 31 to the reference layer 33 are supplied, electrons reflected by the reference layer 33 and then spin-polarized in a direction opposite to the magnetization direction in the reference layer 33 are injected into the memory layer 31. In this case, the magnetization direction in the memory layer 31 is matched with the direction opposite to the magnetization direction in the reference layer 33. Consequently, the magnetization directions in the reference layer 33 and memory layer 31 are anti-parallel. In this anti-parallel state, the resistance value of the resistance change memory element R becomes largest. This state is defined as, for example, "1" data.

Furthermore, data is read from the resistance change memory element R as follows.

A read current is supplied to the resistance change memory element R. This read current is set to a value (a value smaller than the write current) which does not reverse the magnetization direction in the memory layer 31. The above-described "0" or "1" data can be read by detecting a change in resistance value of the resistance change memory element R at this time.

Again, as shown in FIG. 2, the local column switch 11 includes local column selection transistors LYST (LYST0 to LYST3). The first terminals of the local column selection transistors LYST0 to LYST3 are electrically coupled to the local source lines LSL0 to LSL3, respectively. The second terminals of the local column selection transistors LYST0 to LYST3 are commonly, electrically coupled to the global source line GSL. The control terminals of the local column selection transistors LYST0 to LYST3 are electrically coupled to the sub local column control lines SLY0 to SLY3, respectively.

The read/write controller 14 includes a sink transistor T1. The first terminal of the sink transistor T1 is electrically coupled to the global source line GSL. The second terminal of the sink transistor T1 is electrically coupled to a ground voltage terminal (sink). A signal RDSINK is supplied to the control terminal of the sink transistor T1.

The local column switch 15 includes local column selection transistors LYBT (LYBT0 to LYET3). The first terminals of the local column selection transistors LYBT0 to LYBT3 are electrically coupled to the local bit lines LBL0 to LBL3, respectively. The second terminals of the local column selection transistors LYBT0 to LYBT3 are commonly, electrically coupled to the global bit line GBL. The control terminals of the local column selection transistors LYBT0 to LYBT3 are electrically coupled to the sub local column control lines SLY0 to SLY3, respectively.

Note that the sub local column control lines SLY0 to SLY3 on the local bit line LBL side are different from those on the local source line LSL side, and different control circuits supply control signals to the control lines. These control signals are used to execute the same operation. That is, the local column selection transistors LYBT0 and LYST0 are turned on/off at the same time, the local column selection transistors LYBT1 and LYST1 are turned on/off at the same time, the local column selection transistors LYBT2 and LYST2 are turned on/off at the same time, and the local column selection transistors LYBT3 and LYST3 are turned on/off at the same time.

The read/write controller 19 includes the sense amplifier SA, a clamp transistor T2, read enable transistors T3 and T4, a reference transistor T5, and a reference resistance REF.

The first input terminal of the sense amplifier SA is electrically coupled to the first terminal of the read enable transistor T3. The second terminal of the read enable transistor T3 is electrically coupled to the first terminal of the clamp transistor T2. The second terminal of the clamp transistor T2 is electrically coupled to the global bit line GBL. A signal REN is supplied to the control terminal of the read, enable transistor T3. A signal Vclamp is supplied to the control terminal of the clamp transistor T2.

The second input terminal of the sense amplifier SA is electrically coupled to the first terminal of the read enable transistor T4. The second terminal of the read enable transistor T4 is electrically coupled to the first terminal of the reference transistor T5. The second terminal of the reference transistor T5 is electrically coupled to one end of the reference resistance REF. The other end of the reference resistance REF is electrically coupled to the ground voltage terminal. The signal REM is supplied to the control terminal of the read enable transistor T4. A signal Vref is supplied to the control terminal of the reference transistor T5.

The sense amplifier SA reads data from the memory cell MC by sensing a current flowing into the first input terminal (or a voltage supplied to the first input terminal) and a current flowing into the second input terminal (or a voltage supplied to the second input terminal).

Figure 4:
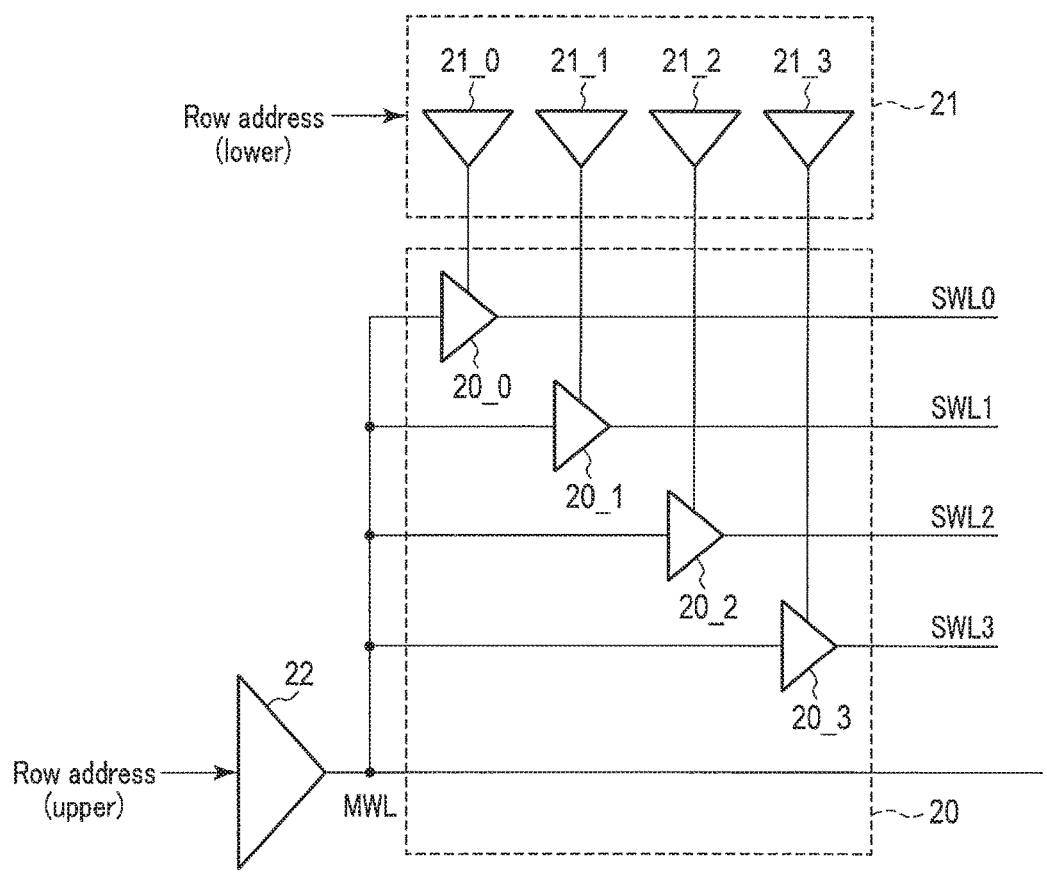
FIG. 4 is a block diagram showing a sub row decoder, a sub word line driver, and a main row decoder in the semiconductor memory device according to the first embodiment.

FIG. 4 is a block diagram showing the sub row decoder 20, the sub word line driver 21, and the main row decoder 22 in the semiconductor memory device according to the first embodiment. FIG. 4 shows an example in which one main word line MWL is provided for the four sub word lines SWL0 to SWL3.

As shown in FIG. 4, the sub word line driver 21 includes first to fourth sub word line drivers 21_0 to 21_3. The sub row decoder 20 includes first to fourth sub row decoders 20_0 to 20_3.

Outputs from the first to fourth sub word line drivers 21_0 to 21_3 are input to the first to fourth sub row decoders 20_0 to 20_3, respectively. An output from the main row decoder 22 is electrically coupled to the main word line MWL, and input to each of the first to fourth sub row decoders 20_0 to 20_3. Outputs from the first to fourth sub row decoders 20_0 to 20_3 are electrically coupled to the sub word lines SWL0 to SWL3, respectively.

The main row decoder 22 decodes the upper row address (for example, the upper bit of a 2-bit row address), and activates the main word line MWL. This activates the first to fourth sub row decoders 20_0 to 20_3 coupled to the main word line MWL. On the other hand, the first to fourth sub word line drivers 21_0 to 21_3 each decode the lower row address (for example, the lower hit of the 2-bit row address), and generate voltages to be supplied to the sub word lines SWL0 to SWL3, respectively. The generated voltages are supplied to the first to fourth sub row decoders 20_0 to 20_3, respectively. The first to fourth sub row decoders 20_0 to 20_3 supply, to the sub word lines SWL0 to SWL3, the voltages supplied from the first to fourth sub word line drivers 21_0 to 21_3, respectively.

FIG. 5 is a circuit diagram showing the sub row decoder 20, the sub word line driver 21, and the main row decoder 22 in the semiconductor memory device according to the first embodiment, and showing FIG. 4 in more detail.

Note that the arrangements of the first to fourth sub word line drivers 21_0 to 21_3 are the same. Thus, the arrangement of the first sub word line driver 21_0 will be described here, and a description of the arrangements of the second to fourth sub word line drivers 21_1 to 21_3 will be omitted. The arrangements of the first to fourth sub row decoders 20_0 to 20_3 are the same. Thus, the arrangement of the first sub row decoder 20_0 will be described here, and a description of the arrangements of the second to fourth sub row decoders 20_1 to 20_3 will be omitted.

As shown in FIG. 5, the main row decoder 22 includes a decoder 22A and an inverter IV4. The decoder 22A decodes the input upper row address. An output (decoding result) from the decoder 22A is input to the inverter IV4. An output from the inverter IV4 is provided to the main word line MWL.

The first sub word line driver 21_0 includes a decoder 21A, inverters IV1 to IV3, delay circuits 21B and 21C, an OR gate O1, a NAND gate NA1, PMOS transistors PM1 and PM2, and an NMOS transistor NM1.

The decoder 21A decodes the input lower row address. An output (decoding result) from the decoder 21A is input to the inverter IV1. The inverter IV1 outputs a signal WDRVb.

The signal WDRVb is input to the first input terminal of the OR gate O1. In addition, the signal WDRVb is input to the second input terminal of the OR gate O1 via the delay circuit 21B and the inverter IV3. The OR gate O1 outputs a signal WDCTL0, and then the signal WDCTL0 is supplied to the control terminal of the PMOS transistor PM1. A voltage vppL is supplied to the first terminal of the PMOS transistor PM1. The second terminal of the PMOS transistor PM1 outputs a signal WDRV.

The signal WDRVb is input to the first input terminal of the NAND gate NA1 via the inverter IV2. Furthermore, the signal WDRVb is input to the first input terminal of the NAND gate NA1 via the inverter IV2 and the delay circuit 21C. A delay time by the delay circuit 21C is equal to or longer than that by the delay circuit 21B. The NAND gate NAW outputs signal WDCTL1, and then the signal WPCTL1 is supplied to the control terminal of the PMOS transistor PM2. A voltage Vpp (≈power supply voltage Vdd>VppL) is supplied to the first terminal of the PMOS transistor PM2. The second terminal of the PMOS transistor PM2 outputs the signal WDRV.

The signal WDRVb is supplied to the control terminal of the NMOS transistor NM1. The first terminal of the NMOS transistor NM1 is coupled to a around voltage terminal (voltage Vss). The second terminal of the NMOS transistor NM1 outputs the signal WDRV.

The first sub row decoder 20_0 includes a PMOS transistor PM3 and NMOS transistors NM2 and NM3.

The control terminals of the PMOS transistor PM3 and NMOS transistor NM2 are electrically coupled to the main word line MWL. The signal WDRV (an output from the first sub word line driver 21_0) is supplied to the first terminal of the PMOS transistor PM3. The second terminal of the PMOS transistor PM3 is electrically coupled to the first terminals of the NMOS transistors NM2 and NM3. The second terminals of the NMOS transistors NM2 and NM3 are electrically coupled to ground voltage terminals. The signal WDRVb is supplied to the control terminal of the NMOS transistor NM3. Furthermore, the second terminal of the PMOS transistor PM3 and the first terminals of the NMOS transistors NM2 and NM3 are electrically coupled to the sub word line SWL0.

[Read Operation Example of First Embodiment]

A reading according to the first embodiment will be described below with reference to FIGS. 6 and 7.

Figure 6:
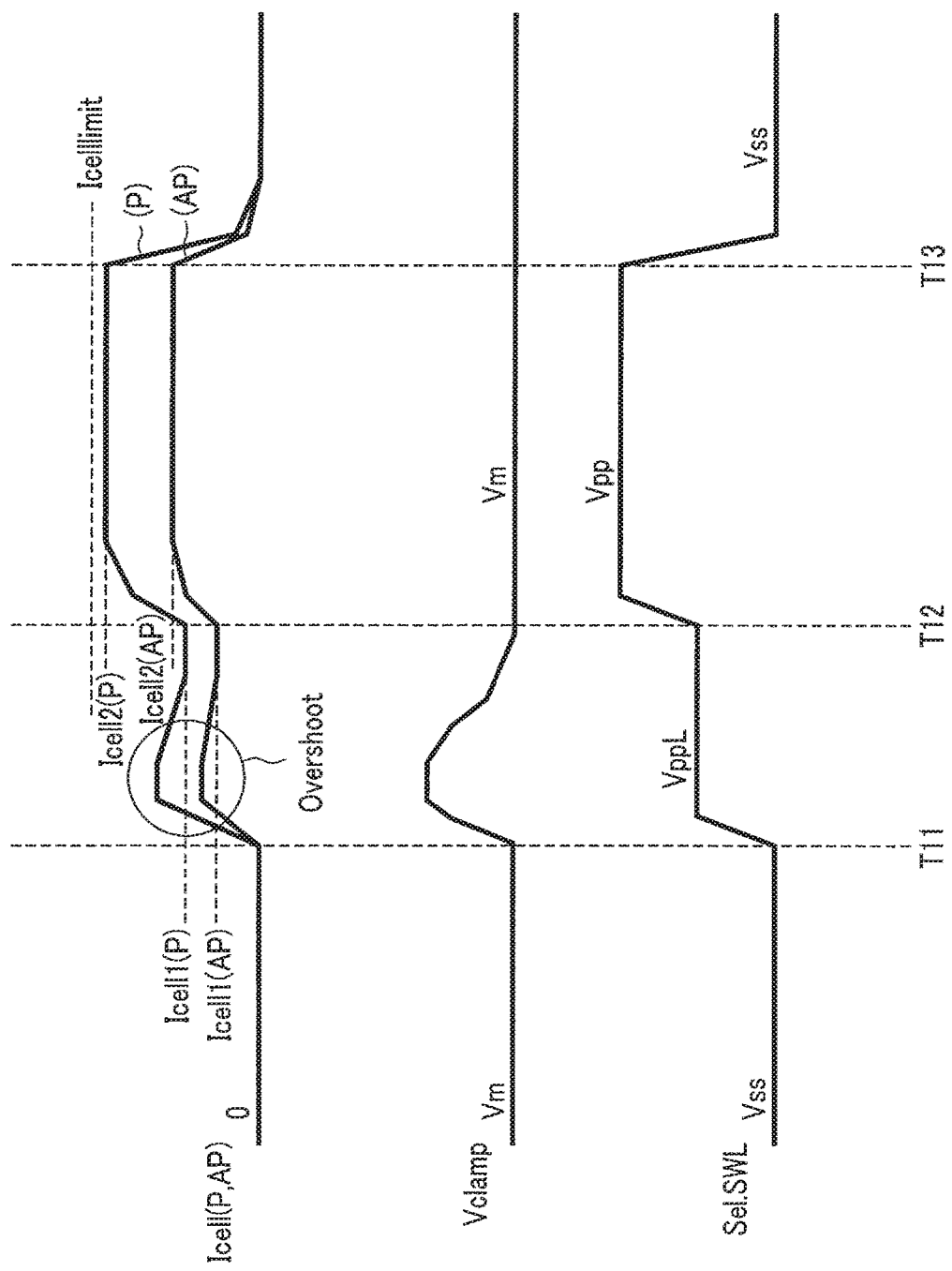
FIG. 6 is a timing chart showing various voltages of the memory cell array and read/write controller in a reading in the semiconductor memory device according to the first embodiment.

FIG. 6 is a timing chart showing various voltages of the memory cell array 10 and read/write controller 19 in a reading in the semiconductor memory device according to the first embodiment. FIG. 7 is a circuit diagram showing the memory cell array 10 and the read/write controller 19 in a reading in the semiconductor memory device according to the first embodiment.

An example in which the memory cell MC coupled to the sub word line SWL0, the local source line LSL0, and the local bit line LBL0 is selected will now be described. In FIG. 6, (P) of a cell current Icell indicates a case in which the memory cell MC is in the P state (low resistance state), and (AP) of the cell current Icell indicates a case in which the memory cell MC is in the AP state (high resistance state).

In this example, in a reading, the voltage of the selected sub word line SWL is raised in two stages in consideration of the rise of the voltage of the signal Vclamp caused by coupling noise and the overshoot of the cell current Icell along with this. This operation will be described in detail below.

As shown in FIG. 6, before time T11, the voltage of the signal Vclamp is raised to a voltage Vm. The voltage Vm is a voltage which turns on the clamp transistor T2 in an analog manner and at which the clamp transistor T2 can transfer a predetermine voltage (a voltage obtained by subtracting a threshold voltage Vth of the clamp transistor T2 from the voltage Vm). In other words, the voltage Vm is a voltage at which the clamp transistor T2 can clamp the voltage of the global bit line GBL to the predetermined voltage.

Next at time T11, the voltage of the selected sub word line SWL (in this example, the sub word line SWL0) is raised to the voltage VppL. The voltage VppL is a voltage which turns on the selection transistor ST in an analog manner. Although not shown, the sub local column control line SLY0, the signal REN, and the sink signal RDSINK change to "H" level" (for example, the power supply voltage Vdd). With this operation, the sink transistor T1, the read enable transistor T3, and the local column selection transistors LYBT0 and LYST0 are digitally turned on. The expression "digitally turned on" indicates a voltage at which the transistor can transfer an arbitrary voltage and the voltage of one of the first and second terminals can be transferred to the other. The expression "digitally turned on" will be simply referred to as "turned on" hereinafter.

Figure 7:
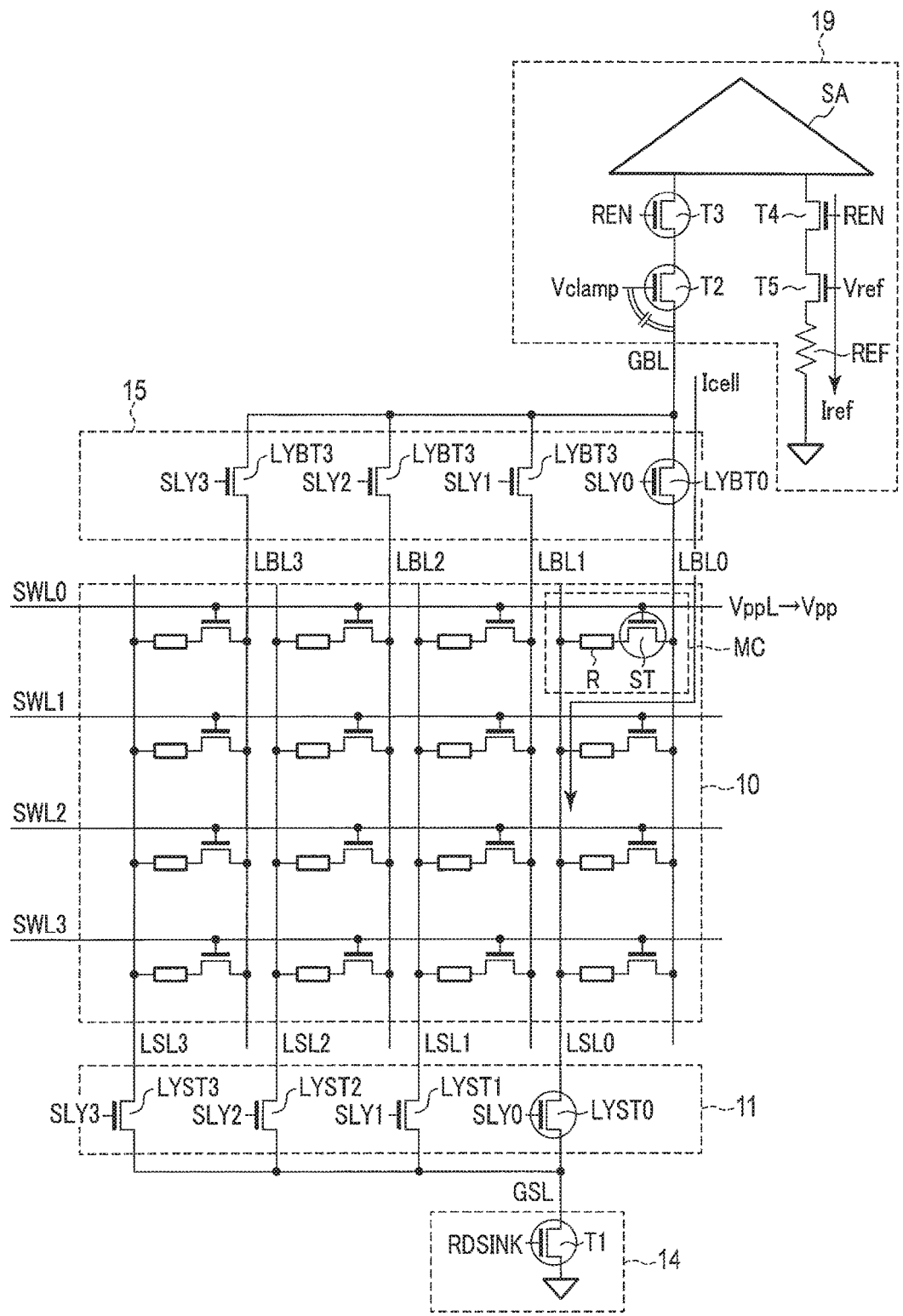
FIG. 7 is a circuit diagram showing the memory cell array and read/write controller in a reading in the semiconductor memory device according to the first embodiment.

As a result, as shown in FIG. 7, the cell current Icell starts to flow into a path from the sense amplifier SA to the sink via the global bit line GBL, the local bit line LBL0, the sub word line SWL0, the local source line LSL0, and the global source line GSL, and the global bit line GBL starts to be charged. Charging of the global bit line GBL raises the voltage of the global bit line GBL. Coupling between the global bit line GBL and the control terminal of the clamp transistor T2 temporarily raises the voltage of the signal Vclamp. The rise of the voltage of the signal Vclamp causes the cell current Icell to overshoot a current Icell1 (Icell1(P) or Icell1(AP)). The current Icell1 is a current which can flow in a steady state under the above voltage conditions. The steady state indicates a state in which charging of the global bit line GBL is complete, the voltage of the signal Vclamp is not raised by coupling noise any more, and the cell current is stable. After that, upon completion of charging of the global bit line GBL, the voltage of the signal Vclamp is lowered to the voltage Vm. As a result, the cell current Icell is set in the steady state and becomes the current Icell1.

Next at time T12, the voltage of the selected sub word line SWL is raised to the voltage Vpp (≈power supply voltage Vdd>VppL). This turns on the selection transistor ST. At this time, since charging of the global bit line GBL is already complete, and the voltage of the signal Vclamp is never raised by coupling to the global bit line GBL. Therefore, the cell current Icell never overshoots, and becomes a current Icell2 (Icell2(P) or Icell2(AP)). The current Icell2 is a current which can flow in the steady state under the above voltage conditions. Note that Icell1<Icell2<Icelllimit holds. That is, the cell current Icell never exceeds the current Icelllimit. The current Icelllimit is a current which increases the possibility of the occurrence of a read disturbance.

On the other hand, although not shown, a reference current Iref flows into a path from the sense amplifier SA to the ground voltage terminal via the reference resistance REF. The sense amplifier SA reads data from the memory cell MC by sensing the cell current Icell and the reference current Iref.

After that, at time T13, the voltage of the selected sub word line SWL is lowered to the voltage Vss. This stops the flow of the cell current Icell, thereby ending the reading.

The above-described control of raising the voltage of the selected sub word line SWL in two stages will be described below with reference to FIGS. 8 and 9.

Figure 8:
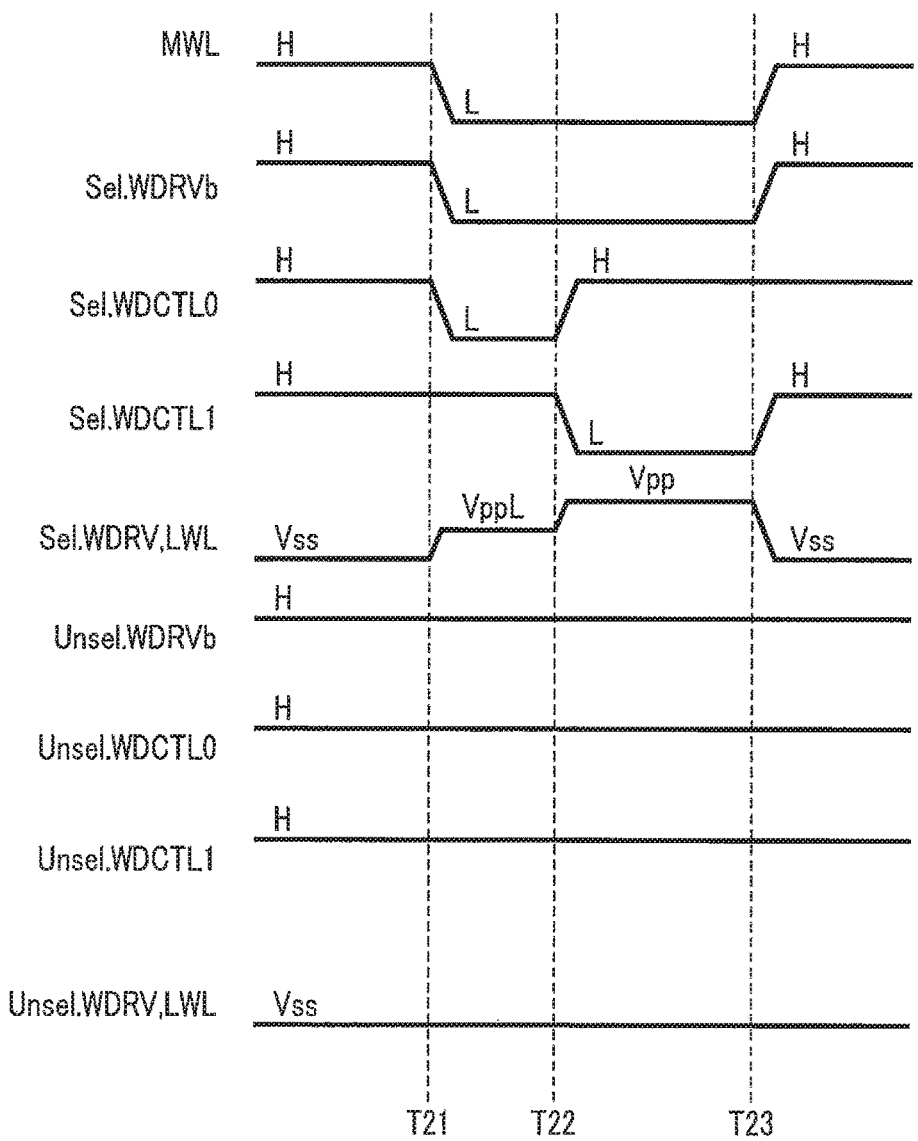
FIG. 8 is a timing chart showing various voltages of the sub row decoder, sub word line driver, and main row decoder in a reading in the semiconductor memory device according to the first embodiment.

FIG. 8 is a timing chart showing various voltages of the sub row decoder 20, sub world line driver 21, and main row decoder 22 in a reading in the semiconductor memory device according to the first embodiment. FIG. 9 is a circuit diagram showing the sub row decoder 20, the sub word line driver 21, and the main row decoder 22 in a reading in the semiconductor memory device according to the first embodiment. An example in which the sub word line SWL0 is selected and the sub word lines SWL1 to SWL3 are unselected will now be described.

In this example, during the first period, the sub word line driver 21 (first sub word line driver 21_0) generates the voltage VppL, and the sub row decoder 20 (first sub row decoder 20_0) supplies the generated voltage VppL to the sub word line SWL0. During the second period (for example, period which is longer than the first period) after the first period, the first sub word line driver 21_0 generates the voltage Vpp higher than the voltage VppL, and the first sub row decoder 20_0 supplies the generated voltage Vpp to the sub word line SWL0. This operation will be described in detail below.

As shown in FIG. 8, in the initial state (before time T21), the main word line MWL and the signals WDRVb, WDCTL0, and WDCTL1 are at "H" level (for example, the power supply voltage Vdd). The sub word line SWL and the signal WDRV have the voltage Vss.

As shown in FIGS. 8 and 9, if the main word line MWL is selected by the upper row address at time T21, the main row decoder 22 (inverter IV4) sets the main word line MWL at "L" level (for example, the ground voltage VSs). With this operation, in the first to fourth sub row decoders 20_0 to 20_3, the NMOS transistors NMI are turned off and the PMOS transistors PM3 are turned on.

Furthermore, if the sub word line SWL0 is selected by the lower row address, the inverter IV1 in the first sub word line driver 21_0 outputs the signal WDRVb of "L" level. This turns off the NMOS transistor NM1 in the first sub word line driver 21_0.

The signal WDRVb of "L" level is input to the first input terminal of the OR gate O1. Since "L" level has been input to the second input terminal of the OR gate O1 in the initial state, the OR gate O1 outputs the signal WDCTL0 of "L" level. This turns on the PMOS transistor PM1 in the first sub word line driver 21_0.

In addition, the signal WDRVb of "L" level is inverted and the signal of "H" level is input to the first input terminal of the NAND gate NA1. Since "L" level has been input to the second input terminal of the NAND gate NA1 in the initial state, the NAND gate NA1 outputs the signal WDCTL1 of "H" level. This turns off the PMOS transistor PM2 in the first sub word line driver 21_0.

Consequently, the PMOS transistor PM1 in the ON state in the first sub word line driver 21_0 transfers the voltage VppL, thereby changing the voltage of the signal WDRV to the voltage VppL. Since the PMOS transistor PM3 in the first sub row decoder 20_0 is ON, the PMOS transistor PM3 transfers the signal WDRV. This changes the voltage of the sub word line SWL0 to the voltage VppL.

Next at time T22, the signal WDRVb of "L" level is delayed and inverted, and the signal of "H" level is input to the second input terminal of the OR gate O1. Since the signal WDRVb of "L" level has been input to the first input terminal of the OR gate O1, the OR gate O1 outputs the signal WDCTL0 of "H" level. This turns off the PMOS transistor PM1 in the first sub word line driver 21_0.

In addition, the signal WDRVb of "L" level" is inverted and delayed, and the signal of "H" level is input to the second input terminal of the NAND gate NA1. Since the signal of "H" level has been input to the first input terminal of the NAND gate NA1, the NAND gate NA1 outputs the signal WDCTL1 of "L" level. This turns on the PMOS transistor PM2 in the first sub word line driver 21_0.

Therefore, the PMOS transistor PM2 in the ON state in the first sub word line driver 21_0 transfers the voltage Vpp, thereby changing the voltage of the signal WDRV to the voltage Vpp. Since the PMOS transistor PM3 in the first sub row decoder 20_0 is ON, the PMOS transistor PM3 transfers the signal WDRV. This changes the voltage of the sub word line SWL0 from the voltage VppL to the voltage Vpp.

After that, at time T23, the main word line MWL is set at "H" level and the signal WDRVb is set at "L" level. This sets the respective signals and the respective control lines in the initial state, thereby ending the reading.

On the other hand, during a period from time T21 to time T23, on the unselected sub word lines SWL1 to SWL3, each of the inverters IV1 in the second to fourth sub word line drivers 21_1 to 21_3 outputs the signal WDRVb of "H" level. This changes the signals WDCTL0 and WDCTL1 to "H" level, thereby turning off the PMOS transistors PM1 and PM2 in the second to fourth sub word line drivers 21_1 to 21_3. On the other hand, the NMOS transistors NM1 in the second to fourth sub word line drivers 21_1 to 21_3 are turned on. Each of the NMOS transistors NM1 in the ON state in the second to fourth sub word line drivers 21_1 to 21_3 transfers the voltage Vss, thereby changing the voltage of the signal WDRV to the voltage Vss. Since the PMOS transistors PM3 in the second to fourth sub row decoders 20_1 to 20_3 are ON, each of the PMOS transistors PM3 transfers the signal WDRV. This changes the voltage of the sub word line SWL0 to the voltage Vss.

[Effect of First Embodiment]

Figure 10:
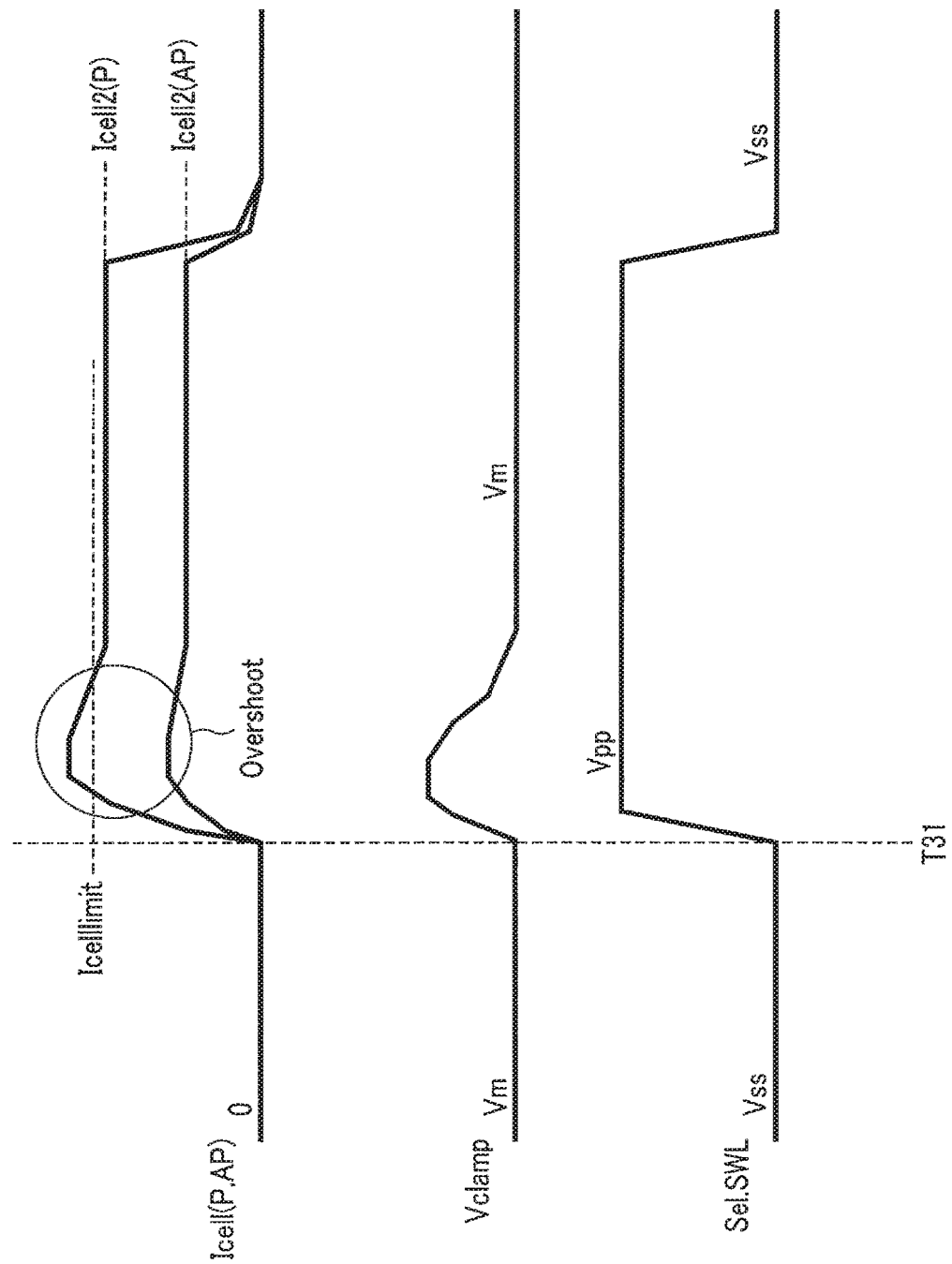
FIG. 10 is a timing chart showing various voltages of a memory cell array and read/write controller in a reading in a semiconductor memory device according to a comparative example.

FIG. 10 is a timing chart showing various voltages of a memory cell array 10 and a read/write controller 19 in a reading in a semiconductor memory device according to a comparative example. In FIG. 10, (P) of a cell current Icell indicates a case in which a memory cell MC is in the P state (low resistance state), and (AP) of the cell current Icell indicates a case in which the memory cell MC is in the AP state (high resistance state).

In the comparative example, in a reading, the voltage of a selected sub word line SWL is raised in one stage. More specifically, as shown in FIG. 10, at time T31, the voltage of the selected sub word line SWL is raised to a voltage Vpp. This causes the cell current Icell to start to flow, and a global bit line GBL starts to be charged. Charging of the global bit line GBL raises the voltage of the global bit line GBL. Therefore, coupling between the global bit line GBL and the control terminal of a clamp transistor T2 temporarily raises the voltage of a signal Vclamp. The rise of the voltage of the signal Vclamp causes the cell current Icell to overshoot a current Icell2. Thus, the cell current Icell exceeds a current Icelllimit. As a result, the occurrence probability of a read disturbance becomes high.

To the contrary, according to the first embodiment, in a reading, the voltage of the selected sub word line SWL is raised in two stages. More specifically, as shown in FIG. 6, during the first period in which the global bit line GBL is charged (the period in which the voltage of the signal Vclamp is raised by coupling noise, that is, the period in which the cell current Icell overshoots), the voltage of the sub word line SWL is raised to the voltage VppL. Then, during the second period in which charging of the global bit line GBL is complete, the voltage of the sub word line SWL is raised to the voltage Vpp.

Therefore, in the steady state during the first period, it is possible to suppress the cell current Icell to the relatively small current Icell1 by the voltage VppL of the sub word line SWL. Thus, during the first period, even if the cell current Icell overshoots the current Icell1, it never exceeds the current Icelllimit. During the second period, charging of the global bit line GBL is already complete, and thus the cell current Icell never overshoots the current Icell2. As a result, it is possible to suppress the occurrence of a read disturbance.

According to the first embodiment, the problem of the overshoot of the cell current Icell (the problem of the read disturbance) is solved by raising the voltage of the selected sub word line SWL in two stages, as described above. In other words, the rise of the voltage of the signal Vclamp caused by coupling noise is not suppressed. At the time of charging the global bit line GBL, the voltage of the signal Vclamp is kept high due to coupling noise. It is, therefore, possible to solve the above problem without decreasing the charging speed of the global bit line GBL.

<Second Embodiment>

A semiconductor memory device according to the second embodiment will be described below with reference to FIGS. 11, 12, 13, 14, and 15. In the second embodiment, in a reading, not the voltage of a sub word line SWL but the voltage of a sub local column control line SLY is raised in two stages. The second embodiment will be described in detail below.

Note that in the second embodiment, the difference from the above-described first embodiment will mainly be explained and a description of the same points will be omitted.

[Arrangement Example of Second Embodiment]

FIG. 11 is a circuit diagram showing a sub local column decoder 16, a local column switch driver 17, and a main local column decoder 18 in the semiconductor memory device according to the second embodiment. FIG. 11 shows a case in which the sub local column decoder 16 and a sub local column decoder 12 are shared and the local column switch driver 17 and a local column switch driver 13 are shared. That is, the corresponding sub local column control lines SLY on the source line side and on the bit line side are selected at the same time.

As shown in FIG. 11, the sub local column decoder 16, local column switch driver 17, and main local column decoder 18 have the same arrangements as those of the sub row decoder 20, sub word line driver 21, and main row decoder 22, respectively.

More specifically, the local column switch driver 17 includes first to fourth local column switch drivers 17_0 to 17_3. The sub local column decoder 16 includes first to fourth sub local column decoders 16_0 to 16_3.

Outputs from the first to fourth local column switch drivers 17_0 to 17_3 are input to the first to fourth, sub local column decoders 16_0 to 16_3, respectively. An output from the main local column decoder 18 is electrically coupled to a main local column control line MLY, and input to each of the first to fourth sub local column decoders 16_0 to 16_3. Outputs from the first to fourth sub local column decoders 16_0 to 16_3 are electrically coupled to sub local column control lines SLY0 to SLY3, respectively.

The main local column decoder 18 decodes an upper column address (for example, the upper bit of a 2-bit column address), and activates the main local column control line MLY. This activates the first to fourth sub local column decoders 16_0 to 16_3 coupled to the main local column control line MLY. On the other hand, the first to fourth local column switch drivers 17_0 to 17_3 each decode a lower column address (for example, the lower bit of the 2-bit row address), and generate voltages to be supplied to the sub local column control lines SLY0 to SLY3, respectively. The generated voltages are supplied to the first to fourth sub local column decoders 16_0 to 16_3, respectively. The first to fourth sub local column decoders 16_0 to 16_3 supply, to the sub local column control lines SLY0 to SLY3, the voltages supplied from the first to fourth local column switch drivers 17_0 to 17_3, respectively.

The sub local column decoder 16, the local column switch driver 17, and the main local column decoder 18 will be described in more detail below.

Note that the arrangements of the first to fourth local column switch drivers 17_0 to 17_3 are the same. Thus, the arrangement of the first local column switch driver 17_0 will be explained here and a description of the arrangements of the second to fourth local column switch drivers 17_1 to 17_3 will be omitted. In addition, the arrangements of the first to fourth sub local column decoders 16_0 to 16_3 are the same. Thus, the arrangement of the first sub local column decoder 16_0 will be explained here and a description of the arrangements of the second to fourth sub local column decoders 16_1 to 16_3 will be omitted.

The main local column decoder 18 includes a decoder 18A and an inverter IV14. The decoder 18A decodes the input upper column address. An output (decoding result) from the decoder 18A is input to the inverter IV14. An output from the inverter IV14 is provided to the main local column control line MLY.

The first local column switch driver 17_0 includes a decoder 17A, inverters IV11 to IV13, delay circuits 17B and 17C, an OR gate O11, a NAND gate NA11, PMOS transistor PM11 and PM12, and an NMOS transistor NM11.

The decoder 17A decodes the input lower column address. An output (decoding result) from the decode 17A is input to the inverter IV11. The inverter IV11 outputs a LYDRVb.

The signal LYDRVb is input to the first input terminal of the OR gate O11. In addition, the signal LYDRVb is input to the second input terminal of the OR gate O11 via the delay circuit 17B and the inverter IV13. The OR gate O11 outputs a signal LYCTL0, and then the signal LYCTL0 is supplied to the control terminal of the PMOS transistor PM11. A voltage VppL is supplied to the first terminal of the PMOS transistor PM11. The second terminal of the PMOS transistor PM11 outputs a signal LYDRV.

The signal LYDRVb is input to the first input terminal of the NAND gate NA11 via the inverter IV12. Furthermore, the signal LYDRVb is inout to the first inout terminal of the NAND gate NA11 via the inverter IV12 and the delay circuit 170. A delay time by the delay circuit 170 is equal to or longer than that by the delay circuit 17B. The NAND Gate NA11 outputs a signal LYDCTL1, and then the signal LYDCTL1 is supplied to the control terminal of the PMOS transistor PM12. A voltage Vpp (≈power supply voltage Vdd>VppL) is supplied to the first terminal of the PMOS transistor PM12. The second terminal of the PMOS transistor PM12 outputs the signal LYDRV.

The signal LYDRVb is supplied to the control terminal of the NMOS transistor NM11. The first terminal of the NMOS transistor NM11 is coupled to a ground voltage terminal (voltage Vss). The second terminal of the NMOS transistor NM11 outputs the signal LYDRV.

The first sub local column decoder 16_0 includes a PMOS transistor PM13 and NMOS transistors NM12 and NM13.

The control terminals of the PMOS transistor PM13 and NMOS transistor NM12 are electrically coupled to the main local column control line MLY. The signal LYDRV (an output from the first local column switch driver 17_0) is supplied to the first terminal of the PMOS transistor PM13. The second terminal of the PMOS transistor PM13 is electrically coupled to the first terminals of the NMOS transistors NM12 and NM13. The second terminals of the NMOS transistors NM12 and NM13 are electrically coupled to around voltage terminals. The signal LYDRVb is supplied to the control terminal of the NMOS transistor NM13. Furthermore, the second terminal of the PMOS transistor PM13 and the first terminals of the NMOS transistors NM12 and NM13 are electrically coupled to the sub local column control line SLY0.

[Read Operation Example of Second Embodiment]

A reading according to the second embodiment will be described below with reference to FIGS. 12 and 13.

Figure 12:
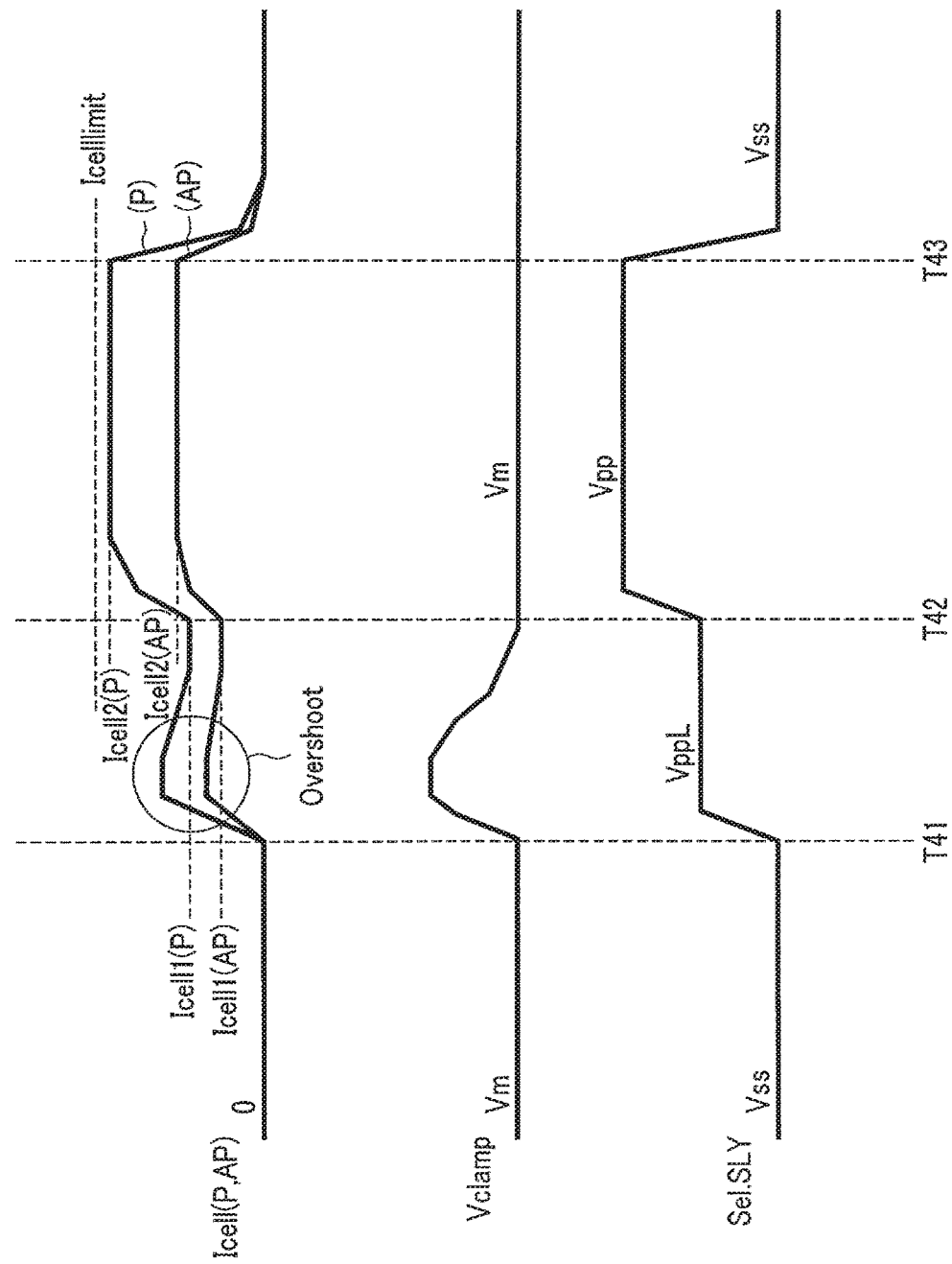
FIG. 12 is a timing chart showing various voltages of a memory cell array and read/write controller in a reading in the semiconductor memory device according to the second embodiment.

FIG. 12 is a timing chart showing various voltages of a memory cell array 10 and a read/write controller 19 in a reading in the semiconductor memory device according to the second embodiment. FIG. 13 is a circuit diagram showing the memory cell array 10 and the read/write controller 19 in a reading in the semiconductor memory device according to the second embodiment.

In this example, in a reading, the voltage of the selected sub local column control line SLY is raised in two stages in consideration of the rise of the voltage of a al Vclamp caused by coupling noise and the overshoot of a cell current Icell along with this. This operation will be described in detail below.

As shown in FIG. 12, before time T41, the voltage of the signal Vclamp is raised to a voltage Vm. This turns on a clamp transistor T2 in an analog manner.

Next at time T41, the voltage of the selected sub local column control line SLY (in this example, the sub local column control line SLY0) is raised to the voltage VppL. This turns on local column selection transistors LYBT0 and LYST0 in an analog manner. Although not shown, a sub word line SWL0, a signal REN, and a sink signal RDSINK change to "H" level (for example, the power supply voltage Vdd). With this operation, a sink transistor T1, a read enable transistor T3, and a selection transistor ST coupled to the sub word line SWL0 are turned on.

As a result, as shown in FIG. 13, the cell current Icell starts to flow into a path from a sense amplifier SA to a sink via a global bit line GBL, a local bit line LBL0, the sub word line SWL0, a local source line LSL0, and a global source line GSL, and the global bit line GBL starts to be charged. Charging of the global bit line GBL raises the voltage of the global bit line GBL. Coupling between the global bit line GBL and the control terminal of the clamp transistor T2 temporarily raises the voltage of the signal Vclamp. The rise of the voltage of the signal Vclamp causes the cell current Icell to overshoot a current Icell1. After that, upon completion of charging of the global bit line GBL, the voltage of the signal Vclamp is lowered to the voltage Vm. As a result, the cell current Icell is set in the steady state and becomes the current Icell1.

Next at time T42, the voltage of the selected sub local column control line SLY is raised to the voltage Vpp. This turns on the local column selection transistor LYBT0 and LYST0. At this time, since charging of the global bit line GBL is already complete, and the voltage of the signal Vclamp is never raised by coupling to the global bit line GBL. Therefore, the cell current Icell never overshoots, and becomes a current Icell2. That is, the cell current Icell never exceeds a current Icelllimit.

After that, at time T43, the voltage of the selected sub local column control line SLY is lowered to the voltage Vss. This stops the flow of the cell current Icell, thereby ending the reading.

The above-described control of raising the voltage of the selected sub local column control line SLY in two stages will be described below with reference to FIGS. 14 and 15.

FIG. 14 is a timing chart showing various voltages of the sub local column decoder 16, the local column switch driver 17, and the main local column decoder 18 in a reading in the semiconductor memory device according to the second embodiment. FIG. 15 is a circuit diagram showing the sub local column decoder 16, the local column switch driver 17, and the main local column decoder 18 in a reading in the semiconductor memory device according to the second embodiment. An example in which the sub local column control line SLY0 is selected and the sub local column control lines SLY1 to SLY3 are unselected will be explained.

In this example, during the first period, the local column switch driver 17 (first local column switch driver 17_0) generates the voltage VppL, and the sub local column decoder 16 (first sub local column decoder 16_0) supplies the generated voltage VppL to the sub local column control line SLY0. During the second period after the first period, the first local column switch driver 17_0 generates the voltage Vpp higher than the voltage VppL, and the first sub local column decoder 16_0 supplies the generated voltage Vpp to the sub local column control line SLY0. This operation will be described in detail below.

As shown in FIG. 14, in the initial state (before time T51), the main local column control line MLY, signals LYDRVb and LYDCTL0, and the signal LYDCTL1 are at "H" level (for example, the power supply voltage Vdd). The sub local column control line SLY and the signal LYDRV have the voltage Vss.

As shown FIGS. 14 and 15, if the main local column control line MLY is selected by the upper row address at time T51, the main local column decoder 18 (inverter IV14) sets the main local column control line MLY at "L" level (for example, the ground voltage Vss). With this operation, in the first to fourth sub local column decoders 16_0 to 16_3, the NMOS transistors NM12 are turned off and the PMOS transistors PM13 are turned on.

Furthermore, if the sub local column control line SLY0 is selected by the lower row address, the inverter IV11 in the first local column switch driver 17_0 outputs the signal LYDRVb of "L" level. This turns off the NMOS transistor NM11 in the first local column switch driver in 17_0.

The signal LYDRVb of "L" level is input to the first input terminal of the OR gate O11. Since "L" level has been input to the second input terminal of the OR gate O11 in the initial state, the OR gate O11 outputs the signal LYDCTL0 of "L" level. This turns on the PMOS transistor PM11 in the first local column switch driver 17_0.

In addition, the signal LYDRVb of "L" level is inverted and the signal of "H" level is input to the first input terminal of the NAND gate NA11. Since "L" level has been input to the second input terminal of the NAND gate NA11 in the initial state, the NAND gate NA11 outputs the signal LYDCTL1 of "H" level. This turns off the PMOS transistor PM12 in the first local column switch driver 17_0.

Consequently, the PMOS transistor PM11 in the ON state in the first local column switch driver 17_0 transfers the voltage VppL, thereby changing the voltage of the signal LYDRV to the voltage VppL. Since the PMOS transistor PM13 in the first sub local column decoder 16_0 is ON, the PMOS transistor PM13 transfers the signal LYDRV. This changes the voltage of the sub local column control line SLY to the voltage VppL.

Next at time T52, the signal LYDRVb of "L" level is delayed and inverted, and the signal of "H" level is input to the second input terminal of the OR gate O11. Since the signal LYDRMb of "L" level has been input to the first input terminal of the OR gate O11, the OR gate O11 outputs the signal LYDCTL0 of "H" level. This turns off the PMOS transistor PM11 in the first local column switch driver 17_0.

The signal LYDRVb of "L" level is inverted and delayed, and the signal of "H" level is input to the second input terminal of the NAND gate NA11. Since the signal of "H" level has been input to the first input terminal of the NAND gate NA11, the NAND gate NA11 outputs the signal LYDCTL1 of "L" level. This turns on the PMOS transistor PM12 in the first local column switch driver 17_0.

Therefore, the PMOS transistor PM12 in the ON state in the first local column switch driver 17_0 transfers the voltage Vpp, thereby changing the voltage of the signal LYDRV to the voltage Vpp. Since the PMOS transistor PM13 in the first sub local column decoder 16_0 is ON, the PMOS transistor PM13 transfers the signal LYDRV. This changes the voltage of the sub local column control line SLY0 from the voltage VppL to the voltage Vpp.

After that, at time T53, the main local column control line MLY is set at "H" level and the signal LYDRVb is set at "L" level. This sets the respective signals and the respective control lines in the initial state, thereby ending the reading.

On the other hand, during a period from time T51 to time T53, on the unselected sub local column control lines SLY1 to SLY3, each of the inverters IV11 in the second to fourth local column switch drivers 17_1 to 17_3 outputs the signal LYDRVb of "H" level. This changes the signals LYDCTL0 and LYDCTL1 to "H" level, thereby turning off the PMOS transistors PM11 and PM12 in the second to fourth local column switch drivers 17_1 to 17_3. On the other hand, the NMOS transistors NM11 in the second to fourth local column switch drivers 17_1 to 17_3 are turned on. Each of the NMOS transistors NM11 in the ON state in the second to fourth local column switch drivers 17_1 to 17_3 transfers the voltage Vss, thereby changing the voltage of the signal LYDRV to the voltage Vss. Since the PMOS transistors PM13 in the second to fourth sub local column decoders 16_1 to 16_3 are ON, each of the PMOS transistors PM13 transfers the signal LYDRV. This changes the voltage of the sub local column control line SLY0 to the voltage Vss.

[Effect of Second Embodiment]

According to the second embodiment, in a reading, the voltage of the selected sub local column control line is raised in two stages. This makes it possible to obtain the same effect as in the first embodiment.

Note that in the reading according to the second embodiment, the reading according to the first embodiment may be executed. That is, in the reading, the voltage of the sub word line SWL may be raised in two stages while raising the voltage of the sub local column control line SLY in two stages.

<Third Embodiment>

A semiconductor memory device according to the third embodiment will be described below with reference to FIGS. 16, 17, and 18. In the third embodiment, a clamp voltage control circuit 40 is provided to control to temporarily raise the voltage of a signal Vclamp in a reading. The third embodiment will be described in detail below.

Note that in the third embodiment, the difference from the above-described first embodiment will mainly be explained and a description of the same points will be omitted.

[Arrangement Example of Third Embodiment]

FIG. 16 is a circuit diagram showing a memory cell array 10, local column switches 11 and 15, and read/write controllers 14 and 19 in the semiconductor memory device according to the third embodiment.

As shown in FIG. 16, the read/write controller 19 includes the clamp voltage control circuit 40. The clamp voltage control circuit 40 supplies the signal Vclamp to the control terminal of a clamp transistor T2. At the time of read, the clamp voltage control circuit 40 controls to temporarily raise the voltage of the signal Vclamp.

[Read Operation Example of Third Embodiment]

A reading according to the third embodiment will be described below with reference to FIGS. 17 and 18.

Figure 17:
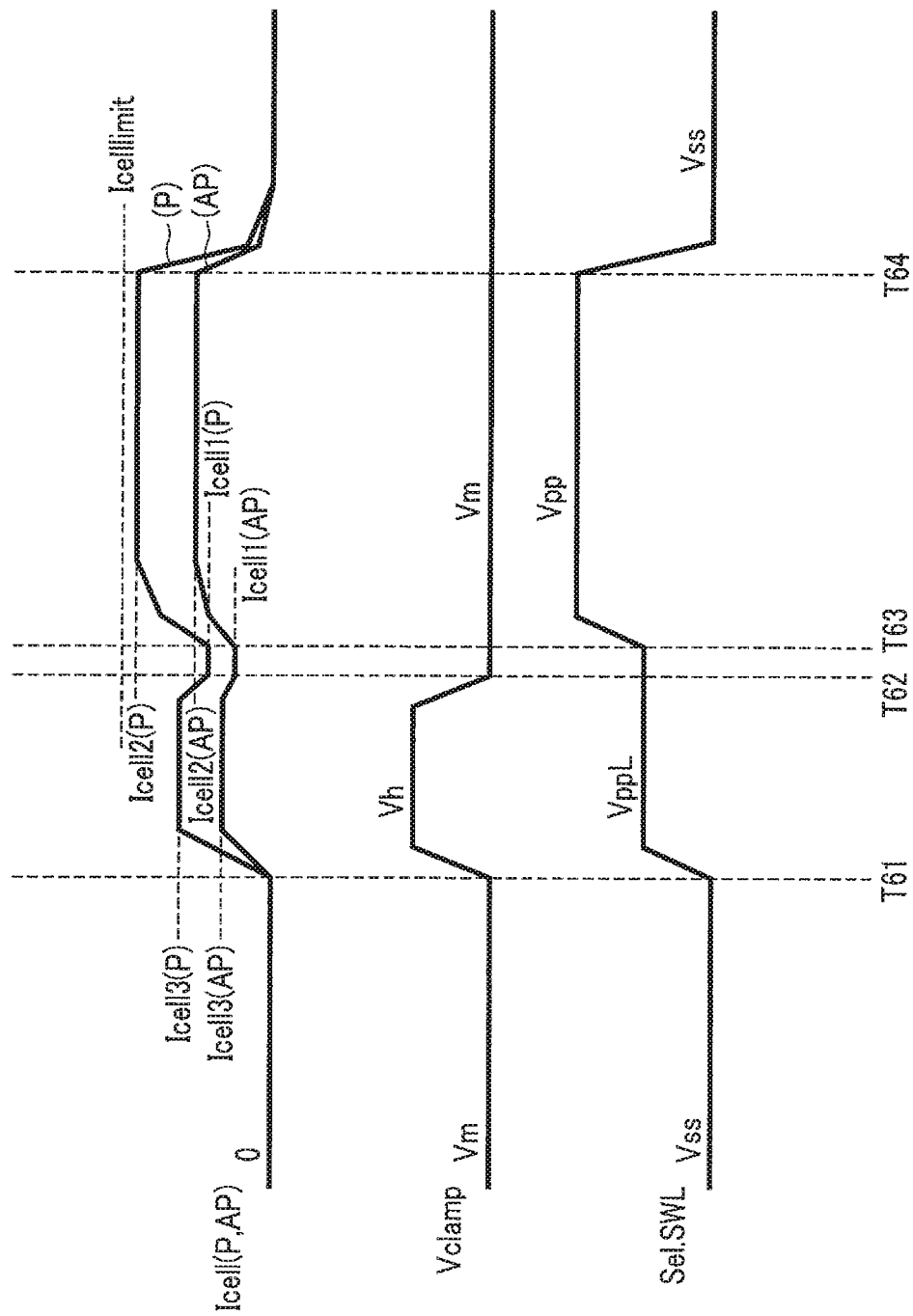
FIG. 17 is a timing chart showing various voltages of the memory cell array and read/write controller in a reading in the semiconductor memory device according to the third embodiment.

FIG. 17 is a timing chart showing various voltages of the memory cell array 10 and read/write controller 19 in a reading in the semiconductor memory device according to the third embodiment. FIG. 18 is a circuit diagram showing the memory cell array 10 and the read/write controller 19 in a reading in the semiconductor memory device according to the third embodiment.

In this example, in a reading, the voltage of a selected sub word line SWL is raised in two stages. In this case, when raising the voltage of the sub word line SWL in the first stage, the clamp voltage control circuit 40 controls to temporarily raise the voltage of the signal Vclamp. This operation will be described in detail below.

As shown in FIG. 17, before time T61, the clamp voltage control circuit 40 raises the voltage of the signal Vclamp to a voltage Vm. This turns on the clamp transistor T2 in an analog manner.

Next at time T61, the voltage of the selected sub word line SWL (in this example, a sub word line SWL0) is raised to a voltage VppL. This turns on a selection transistor ST in an analog manner. Although not shown, a sub local column control line SLY0, a signal REN, and a sink signal RDSINK change to "H" level (for example, a power supply voltage Vdd). With this operation, a sink transistor T1, a read enable transistor T3, and local column selection transistors LYBT0 and LYST0 are turned on.

Figure 18:
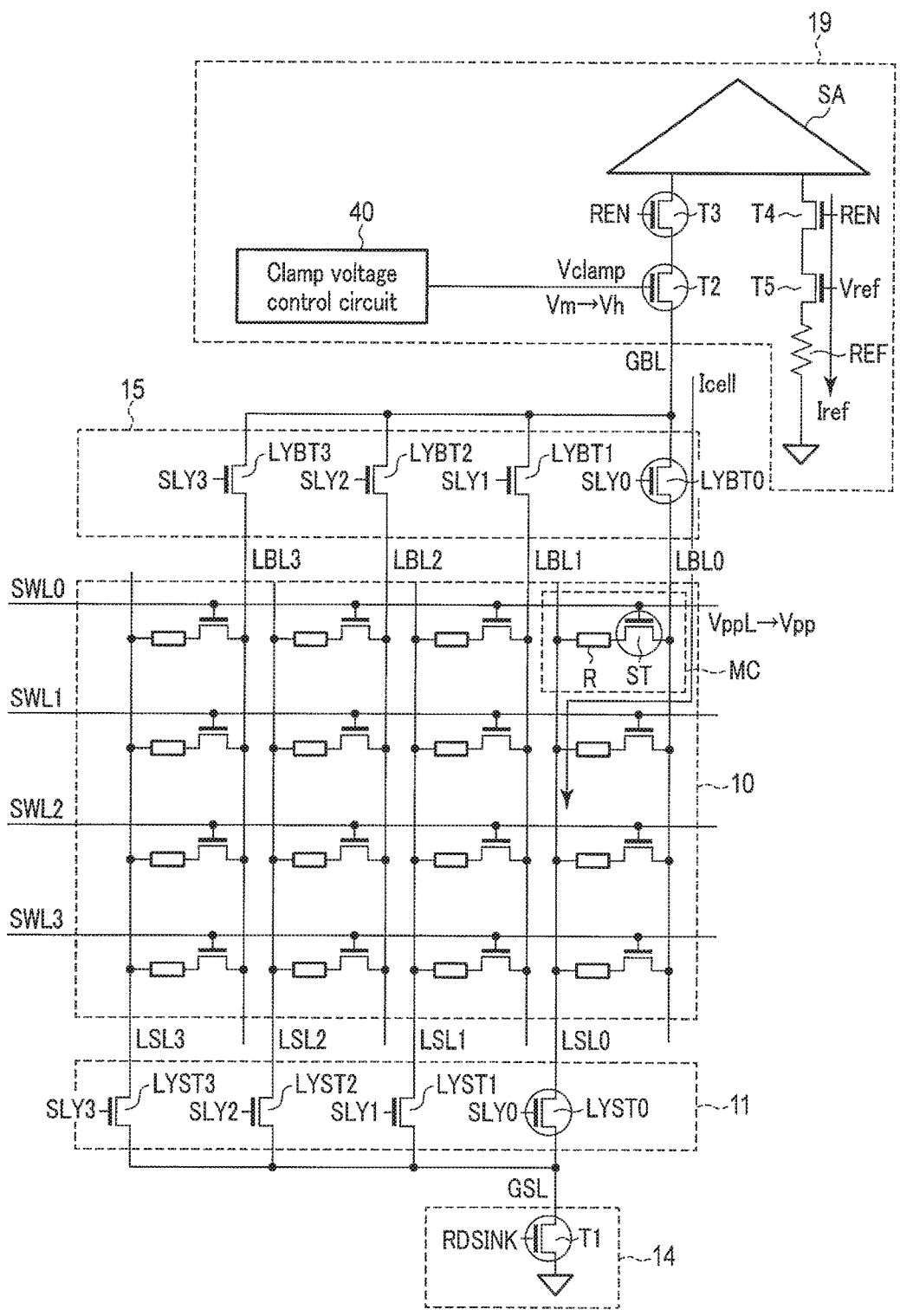
FIG. 18 is a circuit diagram showing the memory cell array and the read/write controller in a reading in the semiconductor memory device according to the third embodiment.

As a result, as shown in FIG. 18, a cell current Icell starts to flow into a path from a sense amplifier SA to a sink via a global bit line GBL, a local bit line LBL0, the sub word line SWL0, a local source line LSL0, and a global source line GSL, and the global bit line GBL starts to be charged.

At this time, the clamp voltage control circuit 40 raises the voltage of the signal Vclamp to a voltage Vh (≈power supply voltage Vdd). Based on the voltage Vh of the signal Vclamp, the cell current Icell becomes a current Icell3 (Icell1<Icell3<Icell2).

After that, upon completion of charging of the global bit line GBL, the clamp voltage control circuit 40 lowers the voltage of the signal Vclamp to a voltage Vm at time T62. As a result, the cell current Icell becomes the current Icell1.

Next at time T63, the voltage of the selected sub word line SWL is raised to a voltage Vpp. This turns on the selection transistor ST. At this time, since charging of the global bit line GBL is already complete, and the voltage of the signal Vclamp is never raised by coupling to the global bit line GBL. Therefore, the cell current Icell never overshoots, and becomes the current Icell2. That is, the cell current Icell never exceeds a current Icelllimit.

After that, at time T64, the voltage of the selected sub word line SWL is lowered to the voltage Vss. This stops the flow of the cell current Icell, thereby ending the reading.

[Effect of Third Embodiment]

According to the third embodiment, the clamp voltage control circuit 40 is provided to control to temporarily raise the voltage of the signal Vclamp in a reading. That is, the voltage of the signal Vclamp is raised not by coupling noise as in the first embodiment but by active control. More specifically, if the voltage of the selected sub word line SWL is raised in two stages, when raising the voltage in the first stage (when applying the voltage VppL), the voltage of the signal Vclamp is raised to the voltage Vh. That is, during the first period (the charging period of the global bit line GBL), the voltage of the signal Vclamp is raised to the voltage Vh, thereby making it possible to increase the charging speed of the global bit line GBL.

On the other hand, as described above, during the first period, even if the voltage of the signal Vclamp is raised, the cell current Icell never exceeds the current Icelllimit. Therefore, it is possible to increase the charging speed of the global bit line GBL while preventing the cell current Icell from exceeding the current Icelllimit.

Note that the third embodiment has explained the example in which if the voltage of the selected sub word line SWL is raised in two stages, as in the first embodiment, when raising the voltage in the first stage, the voltage of the signal Vclamp is raised to the voltage Vh. The third embodiment, however, is not limited to this, and may be applied to the second embodiment. That is, if the voltage of the selected sub local column control line is raised in two stages, as in the second embodiment, when raising the voltage in the first stage, the voltage of the signal Vclamp may be raised to the voltage Vh.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell including a first resistance change memory element and a first transistor;
   a first word line electrically coupled to a control terminal of the first transistor; and
   a first circuit configured to, in a reading, apply a first voltage to the first word line during a first period and apply a second voltage higher than the first voltage to the first word line during a second period after the first period,
   wherein the first circuit includes:
      a second transistor having a first terminal to which the first voltage is supplied, a second terminal electrically coupled to the first word line, and a control terminal to which a first signal is supplied;
      a third transistor having a first terminal to which the second voltage is supplied, a second terminal electrically coupled to the first word line, and a control terminal to which a second signal is supplied;

an OR gate having a first input terminal to which a third signal is input and a second input terminal to which the delayed and inverted third signal is input, and configured to output the first signal; and a NAND gate having a first input terminal to which the inverted third signal is input and a second input terminal to which the inverted and delayed third signal is input, and configured to output the second signal.

2. The device of claim 1, wherein the first circuit further includes:

a second circuit configured to output the first signal so as to turn on the second transistor during the first period; and a third circuit configured to output the second signal so as to turn on the third transistor during the second period.

3. The device of claim 1, further comprising:

a sense amplifier electrically coupled to the first memory cell; and a fourth transistor electrically coupled between the first memory cell and the sense amplifier, wherein a third voltage is applied to a control terminal of the fourth transistor before the first period, and a fourth voltage higher than the third voltage is applied to the control terminal of the fourth transistor during the first period.

4. The device of claim 3, wherein the fourth voltage is generated by coupling between the control terminal of the fourth transistor and a first terminal of the fourth transistor.

5. The device of claim 3, further comprising:

a fourth circuit configured to apply the fourth voltage to the control terminal of the fourth transistor.

6. A semiconductor memory device comprising:

a first memory cell including a first resistance change memory element;

a sense amplifier electrically coupled to the first memory cell;

a first transistor electrically coupled between the first memory cell and the sense amplifier;

a first control line electrically coupled to a control terminal of the first transistor; and a first circuit configured to, in a reading, apply a first voltage to the first control line during a first period and apply a second voltage higher than the first voltage to the first control line during a second period after the first period, wherein the first circuit includes:

a third transistor having a first terminal to which the first voltage is supplied, a second terminal electrically coupled to the first control line, and a control terminal to which a first signal is supplied;

a fourth transistor having a first terminal to which the second voltage is supplied, a second terminal electrically coupled to the first control line, and a control terminal to which a second signal is supplied;

an OR gate having a first input terminal to which a third signal is input and a second input terminal to which the delayed and inverted third signal is input, and configured to output the first signal; and a NAND gate having a first input terminal to which the inverted third signal is input and a second input terminal to which the inverted and delayed third signal is input, and configured to output the second signal.

7. The device of claim 6, further comprising:

a sink electrically coupled to the first memory cell;

a second transistor electrically coupled between the first memory cell and the sink; and a second control line electrically coupled to a control terminal of the second transistor.

8. The device of claim 7, wherein control signals for executing a same operation are supplied to the first control line and the second control line, respectively.

9. The device of claim 6, wherein the first circuit further includes:

a second circuit configured to output the first signal so as to turn on the third transistor during the first period; and a third circuit configured to output the second signal so as to turn on the fourth transistor during the second period.

10. The device of claim 6, further comprising:

a fifth transistor electrically coupled between the first transistor and the sense amplifier, wherein a third voltage is applied to a control terminal of the fifth transistor before the first period, and a fourth voltage higher than the third voltage is applied to the control terminal of the fifth transistor during the first period.

11. The device of claim 10, wherein the fourth voltage is generated by coupling between the control terminal of the fifth transistor and a first terminal of the fifth transistor.

12. The device of claim 10, further comprising:

a fourth circuit configured to apply the fourth voltage to the control terminal of the fifth transistor.

13. A semiconductor memory device comprising:

a first memory cell including a first resistance change memory element and a first transistor;

a first word line electrically coupled to a control terminal of the first transistor; and a first circuit including:

a second transistor with a first terminal to which a first voltage is supplied, a second terminal electrically coupled to the first word line, and a control terminal to which a first signal is supplied;

a third transistor with a first terminal to which a second voltage is supplied, a second terminal electrically coupled to the first word line, and a control terminal to which a second signal is supplied;

an OR gate having a first input terminal to which a third signal is input and a second input terminal to which the delayed and inverted third signal is input, and configured to output the first signal; and a NAND gate having a first input terminal to which the inverted third signal is input and a second input terminal to which the inverted and delayed third signal is input, and configured to output the second signal.

14. The device of claim 13, wherein the first circuit further includes:

a second circuit configured to output the first signal so as to turn on the second transistor during a first period; and a third circuit configured to output the second signal so as to turn on the third transistor during a second period after the first period.

15. The device of claim 1, wherein the second period is longer than the first period.

* * * * *